US 6,219,392 B1

(12) United States Patent
Abe

(10) Patent No.: US 6,219,392 B1
(45) Date of Patent: Apr. 17, 2001

(54) FILTER DEVICE AND METHOD OF ACQUIRING FILTER COEFFICIENTS

(75) Inventor: Ryoji Abe, Yokohama (JP)

(73) Assignee: Matsushita Electric Industrial., Ltd., Osaka (JP)

( * ) Notice: Subject to any disclaimer, the term of this patent is extended or adjusted under 35 U.S.C. 154(b) by 0 days.

(21) Appl. No.: 09/482,080

(22) Filed: Jan. 13, 2000

(30) Foreign Application Priority Data

Jan. 20, 1999 (JP) .................................................. 11-012388

(51) Int. Cl.$^7$ ........................................................ H04B 1/10
(52) U.S. Cl. ............................ 375/350; 708/322; 455/266
(58) Field of Search ..................... 375/350, 346; 455/266, 339, 296, 307; 708/300, 322; 364/724.01, 724.13

(56) References Cited

U.S. PATENT DOCUMENTS

| | | | |
|---|---|---|---|
| 5,339,455 | * | 8/1994 | Vogt et al. ............................ 455/266 |
| 5,777,911 | * | 7/1998 | Sherry et al. .......................... 708/316 |
| 6,047,171 | * | 4/2000 | Khayrallah et al. .................. 455/266 |
| 6,125,155 | * | 9/2000 | Lesthievent et al. ................. 375/350 |

\* cited by examiner

Primary Examiner—Chi Pham
Assistant Examiner—Phuong Phu

(74) Attorney, Agent, or Firm—Louis Woo

(57) ABSTRACT

A filter device includes a first section for receiving data of a desired cutoff frequency. A second section operates for deciding whether the desired cutoff frequency is in a predetermined low frequency band or a predetermined high frequency band. The predetermined low frequency band is lower in frequency than the predetermined high frequency band. A third section stores data of filter coefficients corresponding to different cutoff frequencies in the predetermined low frequency band. A fourth section stores data of precalculated basic coefficients corresponding to different cutoff frequencies in the predetermined high frequency band. The precalculated basic coefficients are equal to values resulting from a part of calculation to provide final filter coefficients. A fifth section operates for calculating final filter coefficients from precalculated basic coefficients through a coefficient expanding process. In cases where the second section decides that the desired cutoff frequency is in the predetermined low frequency band, data of filter coefficients corresponding to the desired cutoff frequency are read out from the third section, and are set in a filtering section. In cases where the second section decides that the desired cutoff frequency is in the predetermined high frequency band, data of precalculated basic coefficients corresponding to the desired cutoff frequency are read out from the fourth section. Then, the fifth section is caused to calculate final filter coefficients from the read-out precalculated basic coefficients, and data of the calculated final filter coefficients are set in the filtering section.

7 Claims, 14 Drawing Sheets

FIG. 7

| Fc(m) | PKG_Gain | PKG_Q | b0 | b1 | b2 | a1 | a2 |
|---|---|---|---|---|---|---|---|
| Fc(1)=20Hz | 5dB | 10 | B0(20,5,10) | B1(20,5,10) | B2(20,5,10) | A1(20,5,10) | A2(20,5,10) |
| Fc(2)=22.4Hz | 5dB | 10 | B0(20.4,5,10) | B1(20.4,5,10) | B2(20.4,5,10) | A1(20.4,5,10) | A2(20.4,5,10) |
| Fc(3)=25Hz | 5dB | 10 | B0(25,5,10) | B1(25,5,10) | B2(25,5,10) | A1(25,5,10) | A2(25,5,10) |
| --- | --- | --- | --- | --- | --- | --- | --- |
| Fc(m−1)=80Hz | 5dB | 10 | B0(80,5,10) | B1(80,5,10) | B2(80,5,10) | A1(80,5,10) | A2(80,5,10) |
| Fc(m)=90Hz | 5dB | 10 | B0(90,5,10) | B1(90,5,10) | B2(90,5,10) | A1(90,5,10) | A2(90,5,10) |

FIG. 8

| Fc(k) | PKG_Gain | PKG_Q | α | β |
|---|---|---|---|---|
| Fc(1)=100Hz | 5dB | 10 | α(100,5,10) | β(100,5,10) |
| Fc(2)=112Hz | 5dB | 10 | α(125,5,10) | β(125,5,10) |
| --- | --- | --- | --- | --- |
| Fc(k−1)=18kHz | 5dB | 10 | α(18k,5,10) | β(18k,5,10) |
| Fc(k)=20kHz | 5dB | 10 | α(20k,5,10) | β(20k,5,10) |

FIG. 10

| Fc(m) | Gain | PKG_Q | b0 | b1 | b2 | a1 | a2 |
|---|---|---|---|---|---|---|---|
| Fc(1)=20Hz | 5dB | 10 | B0(20,5,10) | B1(20,5,10) | B2(20,5,10) | A1(20,5,10) | A2(20,5,10) |
| 21Hz | 5dB | 10 | {B0(1)+B0(2)}/2 | {B1(1)+B1(2)}/2 | {B2(1)+B2(2)}/2 | {A1(1)+A1(2)}/2 | {A2(1)+A2(2)}/2 |
| Fc(2)=22.4Hz | 5dB | 10 | B0(20.4,5,10) | B1(20.4,5,10) | B2(20.4,5,10) | A1(20.4,5,10) | A2(20.4,5,10) |
| 24Hz | 5dB | 10 | {B0(2)+B0(3)}/2 | {B1(2)+B1(3)}/2 | {B2(2)+B2(3)}/2 | {A1(2)+A1(3)}/2 | {A2(2)+A2(3)}/2 |
| Fc(3)=25Hz | 5dB | 10 | B0(25,5,10) | B1(25,5,10) | B2(25,5,10) | A1(25,5,10) | A2(25,5,10) |
|  |  |  |  |  |  |  |  |
| Fc(m−1)=80Hz | 5dB | 10 | B0(80,5,10) | B1(80,5,10) | B2(80,5,10) | A1(80,5,10) | A2(80,5,10) |
| 85Hz | 5dB | 10 | {B0(m−1)+B0(m)}/2 | {B1(m−1)+B1(m)}/2 | {B2(m−1)+B2(m)}/2 | {A1(m−1)+A1(m)}/2 | {A2(m−1)+A2(m)}/2 |
| Fc(m)=90Hz | 5dB | 10 | B0(90,5,10) | B1(90,5,10) | B2(90,5,10) | A1(90,5,10) | A2(90,5,10) |

FIG. 11

| Fc(k) | PKG_Gain | PKG_Q | α | β |
|---|---|---|---|---|
| Fc(1)=100Hz | 5dB | 10 | α(100,5,10) | β(100,5,10) |
| 105Hz | 5dB | 10 | α{Fc(1)+Fc(2)}/2 | β{Fc(1)+Fc(2)}/2 |
| Fc(2)=112Hz | 5dB | 10 | α(125,5,10) | β(125,5,10) |
|  |  |  |  |  |
| Fc(k−1)=18kHz | 5dB | 10 | α(18k,5,10) | β(18k,5,10) |
| 19.2kHz | 5dB | 10 | α{Fc(k−1)+Fc(k)}/2 | β{Fc(k−1)+Fc(k)}/2 |
| Fc(k)=20kHz | 5dB | 10 | α(20k,5,10) | β(20k,5,10) |

FILTER DEVICE AND METHOD OF ACQUIRING FILTER COEFFICIENTS

BACKGROUND OF THE INVENTION

1. Field of the Invention

This invention relates to a filter device such as a digital filter device having a variable cutoff frequency. Also, this invention relates to a method of acquiring filter coefficients to be set in a filter device.

2. Description of the Related Art

It is known to use a digital signal processor (DSP) to form a filtering section of a digital filter device having a variable cutoff frequency. The filtering section of such a digital filter device contains a memory loaded with a signal of a set of filter coefficients. The actual cutoff frequency of the digital filter device is determined by the set of the filter coefficients.

A first known digital filter device includes a DSP-based filtering section having a variable cutoff frequency, and a ROM storing signals of sets of filter coefficients which correspond to different cutoff frequencies respectively. The ROM is accessed in response to an input command signal representative of a desired cutoff frequency so that a signal of a set of filter coefficients corresponding to the desired cutoff frequency will be read out from the ROM. The read-out signal of the filter coefficient set is written into a memory within the filtering section to equalize the actual cutoff frequency of the filtering section to the desired cutoff frequency. When many signals of sets of filter coefficients are required to be stored in the ROM, the capacity of the ROM needs to be great.

A second known digital filter device includes a DSP-based filtering section having a variable cutoff frequency, and a CPU programmed to calculate a set of filter coefficients. Specifically, the CPU calculates a set of filter coefficients from a desired cutoff frequency represented by an input command signal. The CPU writes a signal of the set of the calculated filter coefficients into a memory within the filtering section to equalize the actual cutoff frequency of the filtering section to the desired cutoff frequency. When accurate and fast calculation of filter coefficients is required, a high-grade expensive CPU is needed.

A background-art digital filter device which is not prior art to this invention includes a DSP-based filtering section having a variable cutoff frequency, a ROM storing signals of sets of first filter coefficients which correspond to different cutoff frequencies respectively, and a CPU programmed to calculate a set of second filter coefficients. The ROM is accessed in response to an input command signal representative of a desired cutoff frequency so that a signal of a set of first filter coefficients corresponding to the desired cutoff frequency will be read out from the ROM. The CPU receives the read-out signal of the set of the first filter coefficients. The CPU calculates a set of second filter coefficients from the set of the first filter coefficients. The CPU writes a signal of the set of the calculated second filter coefficients into a memory within the filtering section to equalize the actual cutoff frequency of the filtering section to the desired cutoff frequency. When many signals of sets of first filter coefficients are required to be stored in the ROM, the capacity of the ROM needs to be great. When accurate and fast calculation of second filter coefficients is required, a high-grade expensive CPU is needed.

SUMMARY OF THE INVENTION

It is a first object of this invention to provide an improved filter device.

It is a second object of this invention to provide an improved method of acquiring filter coefficients.

A first aspect of this invention provides a filter device comprising first means for receiving data of a desired cutoff frequency; second means for deciding whether the desired cutoff frequency is in a predetermined low frequency band or a predetermined high frequency band, the predetermined low frequency band being lower in frequency than the predetermined high frequency band; third means for storing data of filter coefficients corresponding to different cutoff frequencies in the predetermined low frequency band; fourth means for storing data of precalculated basic coefficients corresponding to different cutoff frequencies in the predetermined high frequency band, the precalculated basic coefficients being equal to values resulting from a part of calculation to provide final filter coefficients; fifth means for calculating final filter coefficients from precalculated basic coefficients through a coefficient expanding process; a filtering section; sixth means for, in cases where the second means decides that the desired cutoff frequency is in the predetermined low frequency band, reading out data of filter coefficients corresponding to the desired cutoff frequency from the third means, and setting the data of the filter coefficients corresponding to the desired cutoff frequency in the filtering section; and seventh means for, in cases where the second means decides that the desired cutoff frequency is in the predetermined high frequency band, reading out data of precalculated basic coefficients corresponding to the desired cutoff frequency from the fourth means, causing the fifth means to calculate final filter coefficients from the read-out precalculated basic coefficients, and setting data of the calculated final filter coefficients in the filtering section.

A second aspect of this invention is based on the first aspect thereof, and provides a filter device further comprising first interpolating means for implementing interpolation with respect to the filter coefficients represented by the data read out from the third means, and second interpolating means for implementing interpolation with respect to the data read out from the fourth means or the final filter coefficients calculated by the fifth means.

A third aspect of this invention is based on the first aspect thereof, and provides a filter device further comprising first interpolating means for implementing logarithmic interpolation with respect to the filter coefficients represented by the data read out from the third means, and second interpolating means for implementing logarithmic interpolation with respect to the data read out from the fourth means or the final filter coefficients calculated by the fifth means.

A fourth aspect of this invention provides a filter device comprising first means for receiving data of a desired cutoff frequency; second means for deciding which of a predetermined low frequency band, a predetermined intermediate frequency band, and a predetermined high frequency band the desired cutoff frequency exists in, the predetermined low frequency band being lower in frequency than the predetermined intermediate frequency band, the predetermined intermediate frequency band being lower in frequency than the predetermined high frequency band; third means for storing data of filter coefficients corresponding to different cutoff frequencies in the predetermined low frequency band; fourth means for storing data of precalculated basic coefficients corresponding to different cutoff frequencies in the predetermined intermediate frequency band, the precalculated basic coefficients being equal to values resulting from a part of calculation to provide final filter coefficients; fifth means for calculating final filter coefficients from precalculated basic coefficients through a coefficient expanding process; sixth means for calculating filter coefficients from a cutoff frequency in the predetermined high frequency band; a filtering section; seventh means for, in cases where the second means decides that the desired cutoff frequency is in the predetermined low frequency band, reading out data of filter coefficients corresponding to the desired cutoff frequency from the third means, and setting the data of the filter coefficients corresponding to the desired cutoff frequency in the filtering section; eighth means for, in cases where the second means decides that the desired cutoff frequency is in the predetermined intermediate frequency band, reading out data of precalculated basic coefficients corresponding to the desired cutoff frequency from the fourth means, causing the fifth means to calculate final filter coefficients from the read-out precalculated basic coefficients, and setting data of the calculated final filter coefficients in the filtering section; and ninth means for, in cases where the second means decides that the desired cutoff frequency is in the predetermined high frequency band, causing the sixth means to calculate filter coefficients from the desired cutoff frequency, and setting data of the calculated filter coefficients in the filtering section.

A fifth aspect of this invention is based on the fourth aspect thereof, and provides a filter device further comprising first interpolating means for implementing interpolation with respect to the filter coefficients represented by the data read out from the third means, and second interpolating means for implementing interpolation with respect to the data read out from the fourth means or the final filter coefficients calculated by the fifth means.

A sixth aspect of this invention is based on the fourth aspect thereof, and provides a filter device further comprising first interpolating means for implementing logarithmic interpolation with respect to the filter coefficients represented by the data read out from the third means, and second interpolating means for implementing logarithmic interpolation with respect to the data read out from the fourth means or the final filter coefficients calculated by the fifth means.

A seventh aspect of this invention is based on the second aspect thereof, and provides a filter device wherein each of the first and second interpolating means comprises N partial interpolating means for implementing double interpolation, and N denotes a predetermined natural number equal to or greater than 2.

An eighth aspect of this invention is based on the third aspect thereof, and provides a filter device wherein each of the first and second logarithmically interpolating means comprises N partial logarithmically interpolating means for implementing double logarithmic interpolation, and N denotes a predetermined natural number equal to or greater than 2.

A ninth aspect of this invention is based on the fifth aspect thereof, and provides a filter device wherein each of the first and second interpolating means comprises N partial interpolating means for implementing double interpolation, and N denotes a predetermined natural number equal to or greater than 2.

A tenth aspect of this invention is based on the sixth aspect thereof, and provides a filter device wherein each of the first and second logarithmically interpolating means comprises N partial logarithmically interpolating means for implementing double logarithmic interpolation, and N denotes a predetermined natural number equal to or greater than 2.

An eleventh aspect of this invention provides a method of acquiring filter coefficients. The method comprises the steps of 1) receiving data of a desired cutoff frequency; 2) deciding whether the desired cutoff frequency is in a predetermined low frequency band or a predetermined high frequency band, the predetermined low frequency band being lower in frequency than the predetermined high frequency band; 3) in cases where the step 2) decides that the desired cutoff frequency is in the predetermined low frequency band, reading out data of filter coefficients corresponding to the desired cutoff frequency from a first memory section, and setting the data of the filter coefficients corresponding to the desired cutoff frequency in a filtering section; and 4) in cases where the step 2) decides that the desired cutoff frequency is in the predetermined high frequency band, reading out data of precalculated basic coefficients corresponding to the desired cutoff frequency from a second memory section, calculating final filter coefficients from the read-out precalculated basic coefficients through a coefficient expanding process, and setting data of the calculated final filter coefficients in the filtering section.

A twelfth aspect of this invention provides a method of acquiring filter coefficients. The method comprises the steps of 1) receiving data of a desired cutoff frequency; 2) deciding which of a predetermined low frequency band, a predetermined intermediate frequency band, and a predetermined high frequency band the desired cutoff frequency exists in, the predetermined low frequency band being lower in frequency than the predetermined intermediate frequency band, the predetermined intermediate frequency band being lower in frequency than the predetermined high frequency band; 3) in cases where the step 2) decides that the desired cutoff frequency is in the predetermined low frequency band, reading out data of filter coefficients corresponding to the desired cutoff frequency from a first memory section, and setting the data of the filter coefficients corresponding to the desired cutoff frequency in a filtering section; 4) in cases where the step 2) decides that the desired cutoff frequency is in the predetermined intermediate frequency band, reading out data of precalculated basic coefficients corresponding to the desired cutoff frequency from a second memory section, calculating final filter coefficients from the read-out precalculated basic coefficients through a coefficient expanding process, and setting data of the calculated final filter coefficients in the filtering section; and 5) in cases where the step 2 decides that the desired cutoff frequency is in the predetermined high frequency band, calculating filter coefficients from the desired cutoff frequency, and setting data of the calculated filter coefficients in the filtering section.

A thirteenth aspect of this invention provides a filter device comprising first means for deciding whether a desired cutoff frequency is in a predetermined low frequency band or a predetermined high frequency band, the predetermined low frequency band being lower in frequency than the predetermined high frequency band; second means for storing data of filter coefficients corresponding to different cutoff frequencies in the predetermined low frequency band; third means for storing data of precalculated basic coefficients corresponding to different cutoff frequencies in the predetermined high frequency band, the precalculated basic coefficients being equal to values resulting from a part of calculation to provide final filter coefficients; a filtering section; fourth means for, in cases where the first means decides that the desired cutoff frequency is in the predetermined low frequency band, reading out data of filter coefficients corresponding to the desired cutoff frequency from the second means, and setting the data of the filter coefficients corresponding to the desired cutoff frequency in the filtering section; and fifth means for, in cases where the first means decides that the desired cutoff frequency is in the predetermined high frequency band, reading out data of precalculated basic coefficients corresponding to the desired cutoff frequency from the third means, calculating final filter coefficients from the read-out precalculated basic coefficients through a coefficient expanding process, and setting data of the calculated final filter coefficients in the filtering section.

A fourteenth aspect of this invention provides a filter device comprising first means for deciding which of a predetermined low frequency band, a predetermined intermediate frequency band, and a predetermined high frequency band the desired cutoff frequency exists in, the predetermined low frequency band being lower in frequency than the predetermined intermediate frequency band, the predetermined intermediate frequency band being lower in frequency than the predetermined high frequency band; second means for storing data of filter coefficients corresponding to different cutoff frequencies in the predetermined low frequency band; third means for storing data of precalculated basic coefficients corresponding to different cutoff frequencies in the predetermined intermediate frequency band, the precalculated basic coefficients being equal to values resulting from a part of calculation to provide final filter coefficients; a filtering section; fourth means for, in cases where the first means decides that the desired cutoff frequency is in the predetermined low frequency band, reading out data of filter coefficients corresponding to the desired cutoff frequency from the second means, and setting the data of the filter coefficients corresponding to the desired cutoff frequency in the filtering section; fifth means for, in cases where the first means decides that the desired cutoff frequency is in the predetermined intermediate frequency band, reading out data of precalculated basic coefficients corresponding to the desired cutoff frequency from the third means, calculating final filter coefficients from the read-out precalculated basic coefficients, and setting data of the calculated final filter coefficients in the filtering section; and sixth means for, in cases where the first means decides that the desired cutoff frequency is in the predetermined high frequency band, calculating filter coefficients from the desired cutoff frequency, and setting data of the calculated filter coefficients in the filtering section.

BRIEF DESCRIPTION OF THE DRAWINGS

FIG. 7 is a diagram of a filter coefficient table provided in a first memory section in FIG. 6.

FIG. 8 is a diagram of a filter coefficient table provided in a second memory section in FIG. 6.

FIG. 10 is a diagram of a table of sets of filter coefficients which include sets of filter coefficients provided by a first averaging section in FIG. 9.

FIG. 11 is a diagram of a table of sets of basic filter coefficients which include sets of basic filter coefficients provided by a second averaging section in FIG. 9.

DESCRIPTION OF THE PREFERRED EMBODIMENTS

Prior-art filter devices and a background-art filter device will be explained below for a better understanding of this invention.

Figure 1:
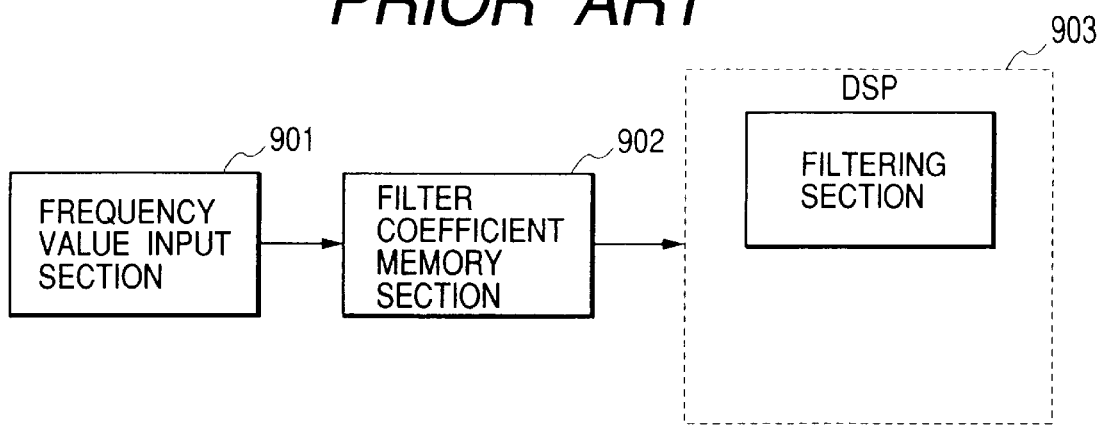
FIG. 1 is a diagram of a first prior-art digital filter device.

FIG. 1 shows a first prior-art digital filter device. The prior-art digital filter device of FIG. 1 includes an input section 901, a memory section 902, and a filtering section 903. The input section 901 receives an input command signal representative of a desired cutoff frequency. The memory section 902 includes a ROM storing signals of sets of filter coefficients which correspond to different cutoff frequencies respectively. The filtering section 903 is formed by a digital signal processor (DSP). The filtering section 903 has a variable cutoff frequency. Specifically, the filtering section 903 includes a memory loaded with a signal of a set of filter coefficients which determines the actual cutoff frequency of the filtering section 903.

The prior-art digital filter device of FIG. 1 operates as follows. When an input command signal is received by the input section 901, the memory section 902 is accessed in response to the input command signal so that a signal of a set of filter coefficients corresponding to a desired cutoff frequency represented by the input command signal is read out from the memory section 902. The read-out signal of the filter coefficient set is written into the memory within the filtering section 903 to equalize the actual cutoff frequency of the filtering section 903 to the desired cutoff frequency.

In the prior-art digital filter device of FIG. 1, when many signals of sets of filter coefficients are required to be stored in the ROM within the memory section 902, the capacity of the ROM needs to be great.

Figure 2:
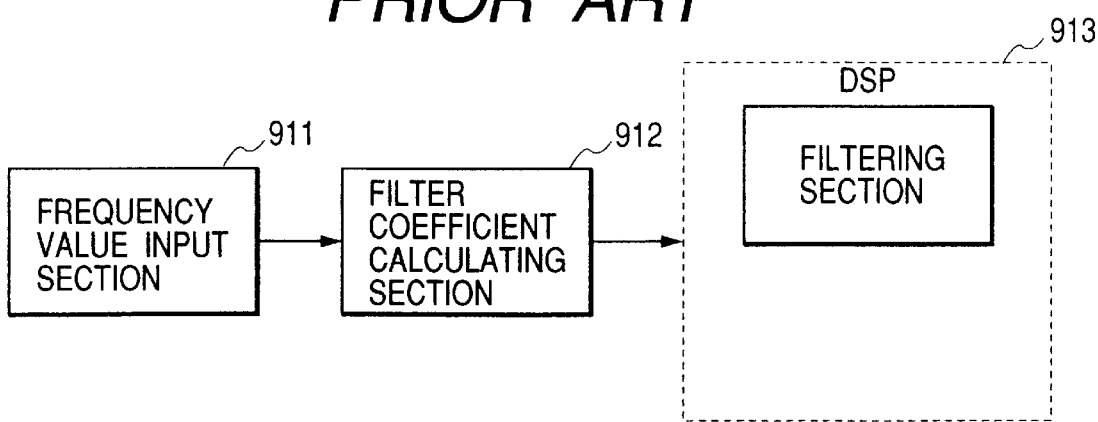
FIG. 2 is a diagram of a second prior-art digital filter device.

FIG. 2 shows a second prior-art digital filter device. The prior-art digital filter device of FIG. 2 includes an input section 911, a calculating section 912, and a filtering section 913. The input section 911 receives an input command signal representative of a desired cutoff frequency. The calculating section 912 includes a CPU programmed to calculate a set of filter coefficients. The filtering section 913 is formed by a DSP. The filtering section 913 has a variable cutoff frequency. Specifically, the filtering section 913 includes a memory loaded with a signal of a set of filter coefficients which determines the actual cutoff frequency of the filtering section 913.

The prior-art digital filter device of FIG. 2 operates as follows. An input command signal is transmitted via the input section 911 to the calculating section 912. The CPU within the calculating section 912 calculates a set of filter coefficients from a desired cutoff frequency represented by the input command signal. The calculating section 912 writes a signal of the set of the calculated filter coefficients into the memory within the filtering section 913 to equalize the actual cutoff frequency of the filtering section 913 to the desired cutoff frequency.

In the prior-art digital filter device of FIG. 2, when accurate and fast calculation of filter coefficients is required, the calculating section 912 needs a high-grade expensive CPU.

Figure 3:
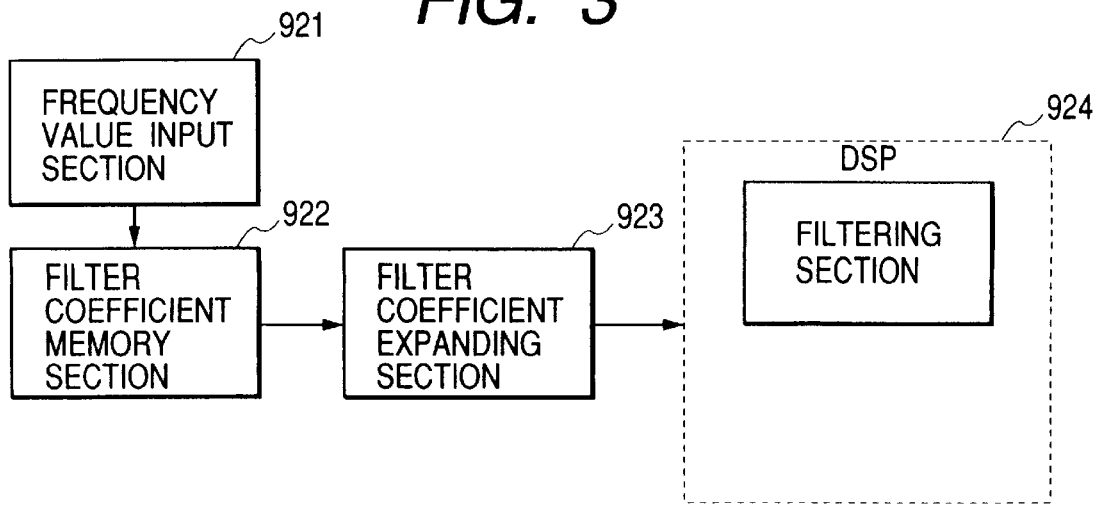
FIG. 3 is a diagram of a background-art digital filter device.

FIG. 3 shows a background-art digital filter device which is not prior art to this invention. The background-art digital filter device of FIG. 3 includes an input section 921, a memory section 922, a calculating section 923, and a filtering section 924. The input section 921 receives an input command signal representative of a desired cutoff frequency. The memory section 922 includes a ROM storing signals of sets of precalculated basic coefficients (basic filter coefficients) which correspond to different cutoff frequencies respectively. The calculating section 923 includes a CPU programmed to calculate a set of final filter coefficients. The filtering section 924 is formed by a DSP. The filtering section 924 has a variable cutoff frequency. Specifically, the filtering section 924 includes a memory loaded with a signal of a set of filter coefficients which determines the actual cutoff frequency of the filtering section 924.

The background-art digital filter device of FIG. 3 operates as follows. When an input command signal is received by the input section 921, the memory section 922 is accessed in response to the input command signal so that a signal of a set of precalculated basic coefficients corresponding to a desired cutoff frequency represented by the input command signal is read out from the memory section 922. The read-out signal of the set of the precalculated basic coefficients is fed to the calculating section 923. The CPU within the calculating section 923 calculates a set of final filter coefficients from the set of the precalculated basic coefficients according to a coefficient expansion algorithm. The set of the calculated final filter coefficients corresponds to the desired cutoff frequency represented by the input command signal. The calculating section 923 writes a signal of the set of the calculated final filter coefficients into the memory within the filtering section 924 to equalize the actual cutoff frequency of the filtering section 924 to the desired cutoff frequency.

In the digital filter device of FIG. 3, when many signals of sets of precalculated basic coefficients (basic filter coefficients) are required to be stored in the ROM within the memory section 922, the capacity of the ROM needs to be great. When accurate and fast calculation of final filter coefficients is required, the calculating section 923 needs a high-grade expensive CPU.

First Embodiment

The theoretical base of a first embodiment of this invention will be explained. In general, the transfer function H(Z) of a second-order IIR (infinite impulse response) filter is expressed as follows.

$$H(Z)=(b_0+b_1Z^{-1}+b_2Z^{-2})/(1-a_1Z^{-1}-a_2Z^{-2}) \quad (1)$$

A parametric equalizer is a filter referred to as a PKG (peaking filter). Parameters related to the parametric equalizer include a cutoff frequency (or a center frequency) "fc", a gain (first gain) "k", and a band width "fB" The transfer function H(S) of the parametric equalizer is defined as follows.

$$H(S)=1+k \cdot HB(S) \quad (2)$$

where HB(S) denotes the transfer function of a second-order BPF (band pass filter), and "k" denotes a second gain related to the first gain "k" as "k=$10^{k/20}-1$". The transfer function HB(S) of the BPF is given by the following equation.

$$HB(S)=(\omega c/Q)S/\{S^2+(\omega c/Q)S+\omega c^2\} \quad (3)$$

where $\omega c=2\pi fc$, and Q denotes a Q factor given as "Q=fB/fc". Thus, the transfer function H(S) of the PKG is expressed as follows.

$$H(S)=1+k(\omega c/Q)S/\{S^2+(\omega c/Q)S+\omega c^2\} \quad (4)$$

When bilinear z-transform is executed, the equation (4) is changed into the following equation.

$$H(Z)=1+k \cdot (1-Z^{-2})/(1-a_1Z^{-1}-a_2Z^{-2}) \quad (5)$$

The equation (5) is rewritten as follows.

$$H(Z)=(b_0+b_1Z^{-1}+b_2Z^{-2})/(1-a_1Z^{-1}-a_2Z^{-2}) \quad (6)$$

where filter coefficients $a_1$, $a_2$, $b_0$, $b_1$, and $b_2$ are given as follows.

$$a_1=A \cdot 2 \cdot (1-\omega c^2)/\{1+(\omega c/Q)+\omega c^2\} \quad (7)$$

$$a_2=A \cdot \{(\omega c/Q)-1-c^2\}/\{1+(\omega c/Q)+\omega c^2\} \quad (8)$$

$$b_0=A \cdot \{1+(1+k) \cdot (\omega c/Q)+\omega c^2\}/\{1+(\omega c/Q)+\omega c^2\} \quad (9)$$

$$b_1=-A \cdot 2 \cdot (1 \cdot \omega c^2)/\{1+(\omega c/Q)+\omega c^2\} \quad (10)$$

$$b_2=A \cdot \{1+(1+k) \cdot (\omega c/Q)+\omega c^2\}/\{1+(\omega c/Q)+\omega c^2\} \quad (11)$$

where "A" denotes a constant. Variables "α" and "β" are used to indicate common terms in the equations (7)–(11). Specifically, the values "α" and "β" represent the common terms as follows.

$$\alpha=(\omega c/Q)/\{1+(\omega c/Q)+\omega c^2\} \quad (12)$$

$$\beta=(1-\omega c^2)/\{1+(\omega c/Q)+\omega c^2\} \quad (13)$$

Sets of the values "α" and "β" which correspond to different cutoff frequencies respectively are previously calculated. The previously-calculated values "α" and "β" are used as precalculated basic coefficients (basic filter coefficients). Signals of the sets of the precalculated basic values (basic filter coefficients) "α" and "β" are stored in a memory such as a ROM. Specifically, the memory (ROM) stores a table in which the sets of the precalculated basic values (basic filter coefficients) "α" and "β" are assigned to different cutoff frequencies respectively. The filter coefficients $a_1$, $a_2$, $b_0$, $b_1$, and $b_2$ are called "final filter coefficients". Expansion equations for calculating final filter coefficients $a_1$, $a_2$, $b_0$, $b_1$, and $b_2$ from precalculated basic coefficients "α" and "β", a Q factor, and a gain "k" are previously determined on the basis of the equations (7)–(13).

The memory (ROM) is accessed in response to an input command signal so that a signal of a set of precalculated basic coefficients (basic filter coefficients) "α" and "β" corresponding to a desired cutoff frequency represented by the input command signal is read out from the memory (ROM) through a table look-up process. A set of final filter coefficients $a_1$, $a_2$, $b_0$, $b_1$, and $b_2$ is calculated from the set of the precalculated basic coefficients "α" and "β", a Q factor, and a gain "k" according to the expansion equations. In this case, the total number of the bits of signals stored in the memory (ROM) is suppressed so that a smaller capacity of the memory (ROM) suffices. In addition, the use of the expansion equations reduces a load on the calculation of a set of final filter coefficients.

Figure 4:
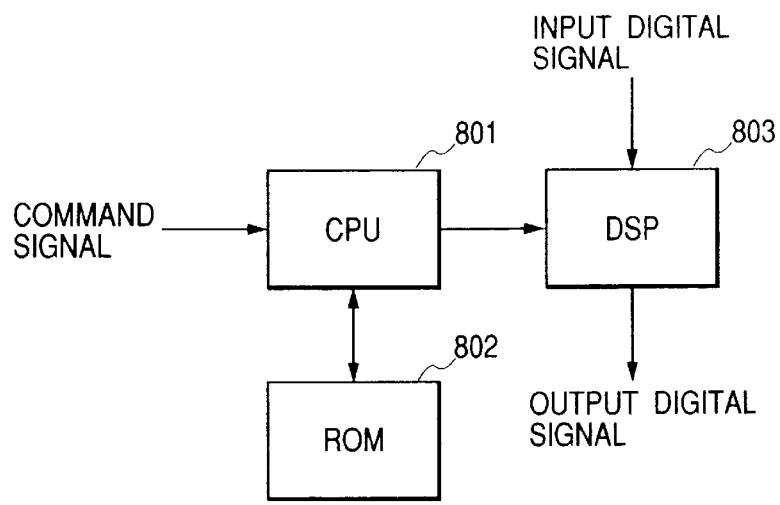
FIG. 4 is a block diagram of a digital filter device according to a first embodiment of this invention.

FIG. 4 shows a digital filter device according to the first embodiment of this invention. The digital filter device of FIG. 4 includes a CPU 801, a ROM 802, and a DSP (digital signal processor) 803. The CPU 801 is connected to the ROM 802 and the DSP 803.

A command signal representing a desired cutoff frequency in either a low frequency band or a high frequency band is inputted into the CPU 801. The CPU 801 includes a combination of an input/output port (an interface), a signal processing section, a RAM, and a ROM. The CPU 801 operates in accordance with a program stored in its internal ROM.

The DSP 803 forms a filtering section corresponding to a PKG (peaking filter) having variable lower-side and higher-side cutoff frequencies. The DSP 803 includes a memory divided into a first section and a second section. The first section of the memory is loaded with a signal of a set of filter coefficients which determines the lower-side cutoff frequency of the filtering section. The second section of the memory is loaded with a signal of a set of filter coefficients which determines the upper-side cutoff frequency of the filtering section.

A digital signal to be filtered is inputted into the DSP 803. The DSP 803 filters the input digital signal according to filtering characteristics corresponding to the PKG. The DSP 803 outputs the filtering-resultant digital signal. The input digital signal is, for example, a digital audio signal. The PKG formed by the DSP 803 has variable cutoff frequencies, that is, a variable lower-side cutoff frequency and a variable higher-side cutoff frequency. The frequency range in which the cutoff frequencies of the PKG are variable extends between 20 Hz and 20 kHz. This frequency range is separated into the low frequency band and the high frequency band. For example, the low frequency band extends between 20 Hz and 100 Hz while the high frequency band extends between 100 Hz and 20 kHz. In general, the lower-side cutoff frequency of the PKG exists in the low frequency band, and the higher-side cutoff frequency of the PKG exists in the high frequency band.

The ROM 802 is divided into a first section and a second section. The first section of the ROM 802 stores signals of sets of previously-calculated filter coefficients $a_1$, $a_2$, $b_0$, $b_1$, and $b_2$ (see the equations (7)–(11)) which correspond to different cutoff frequencies in the low frequency band, respectively. Specifically, the first section of the ROM 802 stores a table in which the sets of the filter coefficients $a_1$, $a_2$, $b_0$, $b_1$, and $b_2$ are assigned to different cutoff frequencies respectively. The second section of the ROM 802 stores signals of sets of precalculated basic coefficients "$\alpha$" and "$\beta$" (see the equations (12) and (13)) which correspond to different cutoff frequencies in the high frequency band, respectively. Specifically, the second section of the ROM 802 stores a table in which the sets of the precalculated basic coefficients "$\alpha$" and "$\beta$" are assigned to different cutoff frequencies respectively. The precalculated basic coefficients are also referred to as the basic filter coefficients.

Figure 5:
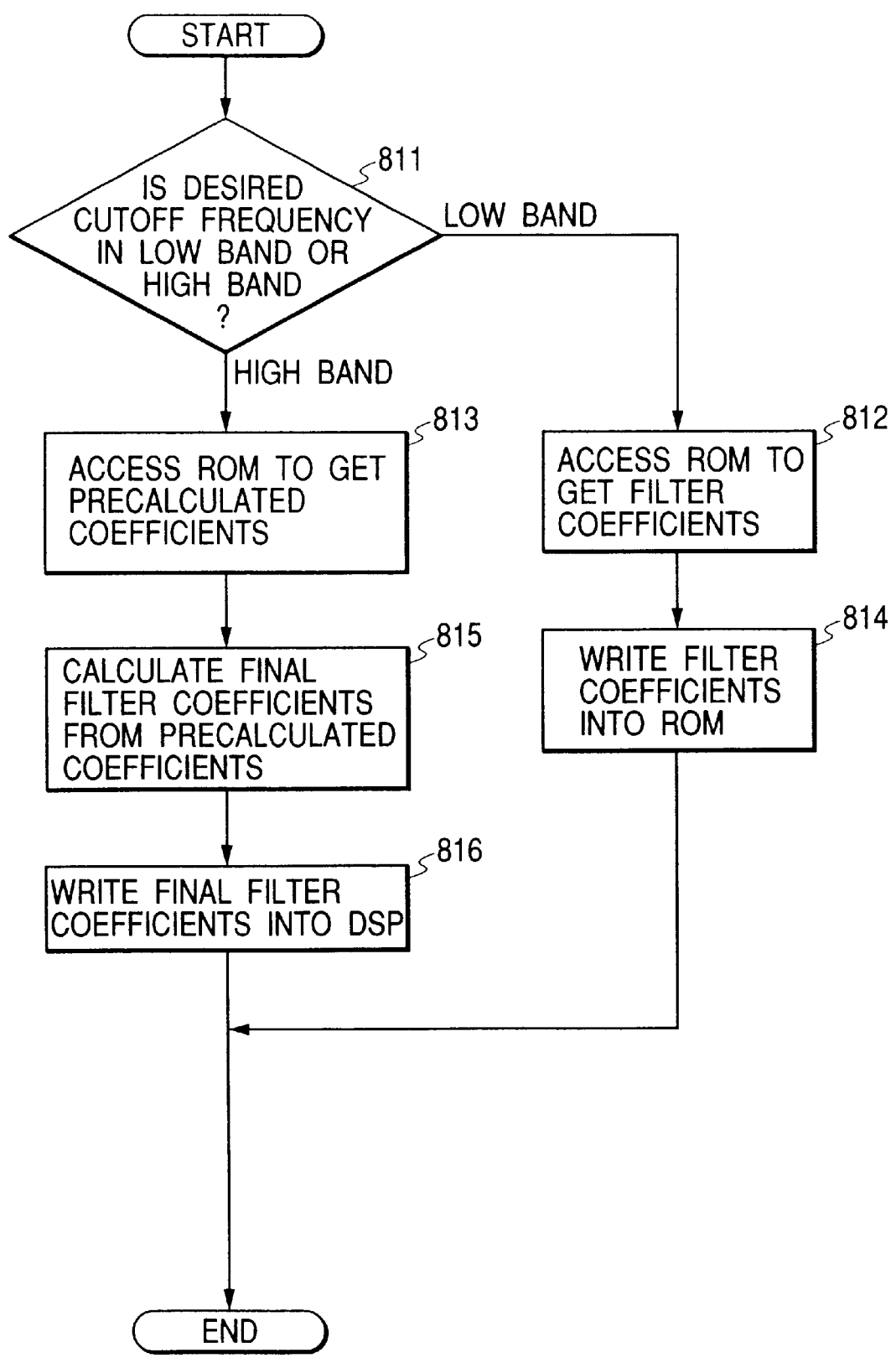
FIG. 5 is a flowchart of a segment of a program for controlling a CPU in FIG. 4.

FIG. 5 is a flowchart of a segment of the program for controlling the CPU 801. The program segment in FIG. 5 is started each time a command signal representative of a desired cutoff frequency is inputted into the CPU 801.

As shown in FIG. 5, a first step 811 of the program segment decides whether the desired cutoff frequency represented by the present command signal is in the low frequency band or the high frequency band. When the desired cutoff frequency is in the low frequency band, the program advances from the step 811 to a step 812. When the desired cutoff frequency is in the high frequency band, the program advances from the step 811 to a step 813.

The step 812 accesses the first section of the ROM 802 in response to the desired cutoff frequency represented by the present command signal. The step 812 implements a table look-up process, and thereby reads out, from the first section of the ROM 802, a signal of a set of filter coefficients $a_1$, $a_2$, $b_0$, $b_1$, and $b_2$ which corresponds to the desired cutoff frequency.

A step 814 following the step 812 writes the signal of the set of the filter coefficients $a_1$, $a_2$, $b_0$, $b_1$, and $b_2$, which is provided by the step 812, into the first section of the memory within the DSP 803. As a result, the actual lower-side cutoff frequency of the filtering section formed by the DSP 803 is set or equalized to the desired cutoff frequency represented by the present command signal. After the step 814, the current execution cycle of the program segment ends.

The step 813 accesses the second section of the ROM 802 in response to the desired cutoff frequency represented by the present command signal. The step 813 implements a table look-up process, and thereby reads out, from the second section of the ROM 802, a signal of a set of precalculated basic coefficients "$\alpha$" and "$\beta$" which corresponds to the desired cutoff frequency.

A step 815 following the step 813 calculates a set of final filter coefficients $a_1$, $a_2$, $b_0$, $b_1$, and $b_2$ from the set of the precalculated basic coefficients "$\alpha$" and "$\beta$" provided by the step 813, a Q factor, and a gain "k" according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "$\alpha$" and "$\beta$", a Q factor, and a gain "k". The Q factor and the gain "k" may be preset or variable. Information of the Q factor and the gain "K" may be fed from an external device (not shown).

A step 816 subsequent to the step 815 generates a signal of the set of the final filter coefficients $a_1$, $a_2$, $b_0$, $b_1$, and $b_2$ which is provided by the step 815. The step 816 writes the signal of the set of the final filter coefficients $a_1$, $a_2$, $b_0$, $b_1$, and $b_2$ into the second section of the memory within the DSP 803. As a result, the actual higher-side cutoff frequency of the filtering section formed by the DSP 803 is set or equalized to the desired cutoff frequency represented by the present command signal. After the step 816, the current execution cycle of the program segment ends.

Figure 6:
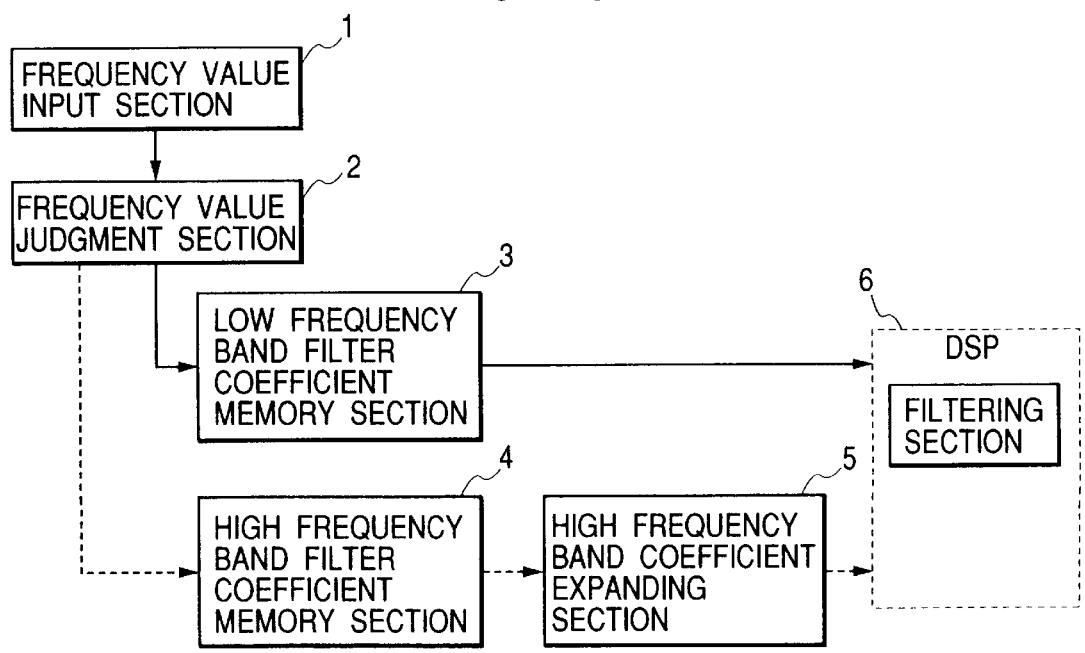
FIG. 6 is an operation flow diagram of the digital filter device in the first embodiment of this invention.

FIG. 6 is an operation flow diagram of the digital filter device in the first embodiment of this invention. With reference to FIG. 6, a command signal representative of a desired cutoff frequency is fed via an input section 1 to a judgement section 2. The input section 1 and the judgment section 2 correspond to the CPU 801 in FIG. 4. The judgment section 2 decides whether the desired cutoff frequency represented by the command signal is in a predetermined low frequency band or a predetermined high frequency band. When the desired cutoff frequency is in the low frequency band, a memory section 3 is used. On the other hand, when the desired cutoff frequency is in the high frequency band, a memory section 4 is used.

The memory sections 3 and 4 correspond to the ROM 802 in FIG. 4. The memory section 3 stores signals of sets of previously1 calculated filter coefficients $a_1$, $a_2$, $b_0$, $b_1$, and $b_2$ (see the equations (7)–(11)) which correspond to different cutoff frequencies in the low frequency band, respectively. The memory section 4 stores signals of sets of precalculated basic coefficients "α" and "β" (see the equations (12) and (13)) which correspond to different cutoff frequencies in the high frequency band, respectively.

In the case where the judgment section 2 decides that the desired cutoff frequency is in the low frequency band, the memory section 3 is accessed in response to the desired cutoff frequency so that a signal of a set of filter coefficients $a_1$, $a_2$, $b_0$, $b_1$, and $b_2$ which corresponds to the desired cutoff frequency is read out therefrom.

Then, the signal of the set of the filter coefficients $a_1$, $a_2$, $b_0$, $b_1$, and $b_2$ is written into a first section of a memory within a filtering section 6 which is assigned to a lower-side cutoff frequency. As a result, the actual lower-side cutoff frequency of the filtering section 6 is set or equalized to the desired cutoff frequency represented by the command signal. The filtering section 6 corresponds to the DSP 803 in FIG. 4. The filtering section 6 provides a PKG (peaking filter).

In the case where the judgment section 2 decides that the desired cutoff frequency is in the high frequency band, the memory section 4 is accessed in response to the desired cutoff frequency so that a signal of a set of precalculated basic coefficients "α" and "β" which corresponds to the desired cutoff frequency is read out therefrom. Then, the read-out signal of the set of the precalculated basic coefficients "α" and "β" is fed to a coefficient expanding section 5. The coefficient expanding section 5 corresponds to the CPU 801 in FIG. 4. The coefficient expanding section 5 calculates a set of final filter coefficients $a_1$, $a_2$, $b_0$, $b_1$, and $b_2$ from the set of the precalculated basic coefficients "α" and "β", a Q factor, and a gain "k" according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The Q factor and the gain "k" may be preset or variable. Information of the Q factor and the gain "k" may be fed from an external device (not shown).

The coefficient expanding section 5 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into a second section of the memory within the filtering section 6 which is assigned to a higher-side cutoff frequency. As a result, the actual higher-side cutoff frequency of the filtering section 6 is set or equalized to the desired cutoff frequency represented by the command signal.

For example, an input digital signal to be filtered by the filtering section 6 is a digital audio signal. As previously indicated, the filtering section 6 provides a PKG (peaking filter). The PKG has variable cutoff frequencies, that is, a variable lower-side cutoff frequency and a variable higher-side cutoff frequency. The frequency range in which the cutoff frequencies of the PKG are variable extends between 20 Hz and 20 kHz. This frequency range is separated into the low frequency band and the high frequency band. For example, the low frequency band extends between 20 Hz and 100 Hz while the high frequency band extends between 100 Hz and 20 kHz. Specifically, the lower-side cutoff frequency "fc" and the higher-side cutoff frequency "fc" of the PKG are in the ranges as follows.

Low Frequency Band: 20 Hz≦fc<100 Hz

High Frequency Band: 100 Hz≦fc≦20 kHz

The memory section 3 stores a table in which as shown in FIG. 7, sets of previously-calculated filter coefficients $a_1$, $a_2$, $b_0$, $b_1$, and $b_2$ are assigned to different cutoff frequencies respectively. In the table, the gain (boot amount) and Q factor of the PKG may also be listed in relation to different cutoff frequencies. The filter coefficients $a_1$, $a_2$, $b_0$, $b_1$, and $b_2$ are expressed by the equations (7)–(11) derived from the transfer function of the digital filter in the equation (6).

The memory section 4 stores a table in which as shown in FIG. 8, sets of precalculated basic coefficients "α" and "β" are assigned to different cutoff frequencies respectively. In the table, the gain (boot amount) and Q factor of the PKG may also be listed in relation to different cutoff frequencies. The precalculated basic coefficients "α" and "β" are expressed by the equations (12) and (13).

Overall operation of the digital filter device in the first embodiment of this invention will be explained. A command signal representative of a desired cutoff frequency is fed via the input section 1 to the judgement section 2. The judgment section 2 decides whether the desired cutoff frequency represented by the command signal is in the low frequency band (20 Hz to 100 Hz) or the high frequency band (100 Hz to 20 kHz).

In the case where the judgment section 2 decides that the desired cutoff frequency is in the low frequency band (20 Hz to 100 Hz), the memory section 3 is accessed in response to the desired cutoff frequency so that a signal of a set of filter coefficients $a_1$, $a_2$, $b_0$, $b_1$, and $b_2$ which corresponds to the desired cutoff frequency is read out therefrom through a table look-up process. Then, the signal of the set of the filter coefficients $a_1$, $a_2$, $b_0$, $b_1$, and $b_2$ is written into the first section of the memory within the filtering section 6 which is assigned to a lower-side cutoff frequency. As a result, the actual lower-side cutoff frequency of the filtering section 6 is set or equalized to the desired cutoff frequency represented by the command signal.

In the case where the judgment section 2 decides that the desired cutoff frequency is in the high frequency band (100 Hz to 20 kHz), the memory section 4 is accessed in response to the desired cutoff frequency so that a signal of a set of precalculated basic coefficients "α" and "β" which corresponds to the desired cutoff frequency is read out therefrom through a table look-up process. In addition, a signal of a PKG gain and a signal of a PKG Q factor may be read out from the memory section 4. Then, the readout signal of the set of the precalculated basic coefficients "α" and "β", the read-out signal of the PKG gain, and the read-out signal of the PKG Q factor are fed to the coefficient expanding section 5. The coefficient expanding section 5 calculates a set of final filter coefficients $a_1$, $a_2$, $b_0$, $b_1$, and $b_2$ from the set of the precalculated basic coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The expansion equations include the equations (7)–(11). The coefficient expanding section 5 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into the second section of the memory within the filtering section 6 which is assigned to a higher-side cutoff frequency. As a result, the actual higher-side cutoff frequency of the filtering section 6 is set or equalized to the desired cutoff frequency represented by the command signal.

As previously mentioned, when the desired cutoff frequency represented by the command signal is in the low frequency band, filter coefficients to be set in the filtering section 6 are determined by the table look-up process in which the memory section 3 is accessed. Thus, it is possible to prevent the occurrence of errors in the filter coefficients set in the filtering section 6 which might be caused by a calculation process. Accordingly, the filtering section 6 can implement an accurate filtering process. In addition, it is possible to reduce an amount of calculation work.

On the other hand, when the desired cutoff frequency represented by the command signal is in the high frequency band, filter coefficients to be set in the filtering section 6 are determined by the table look-up process accessing the memory section 3 and also the coefficient expansion process using the common terms (the equations (12) and (13)) in the coefficient-representing equations (7)–(11). The coefficient expansion process makes it sufficient that the memory section 4 has a small capacity.

Second Embodiment

A second embodiment of this invention is similar to the first embodiment (FIGS. 4–8) thereof except for design changes indicated hereinafter.

Figure 9:
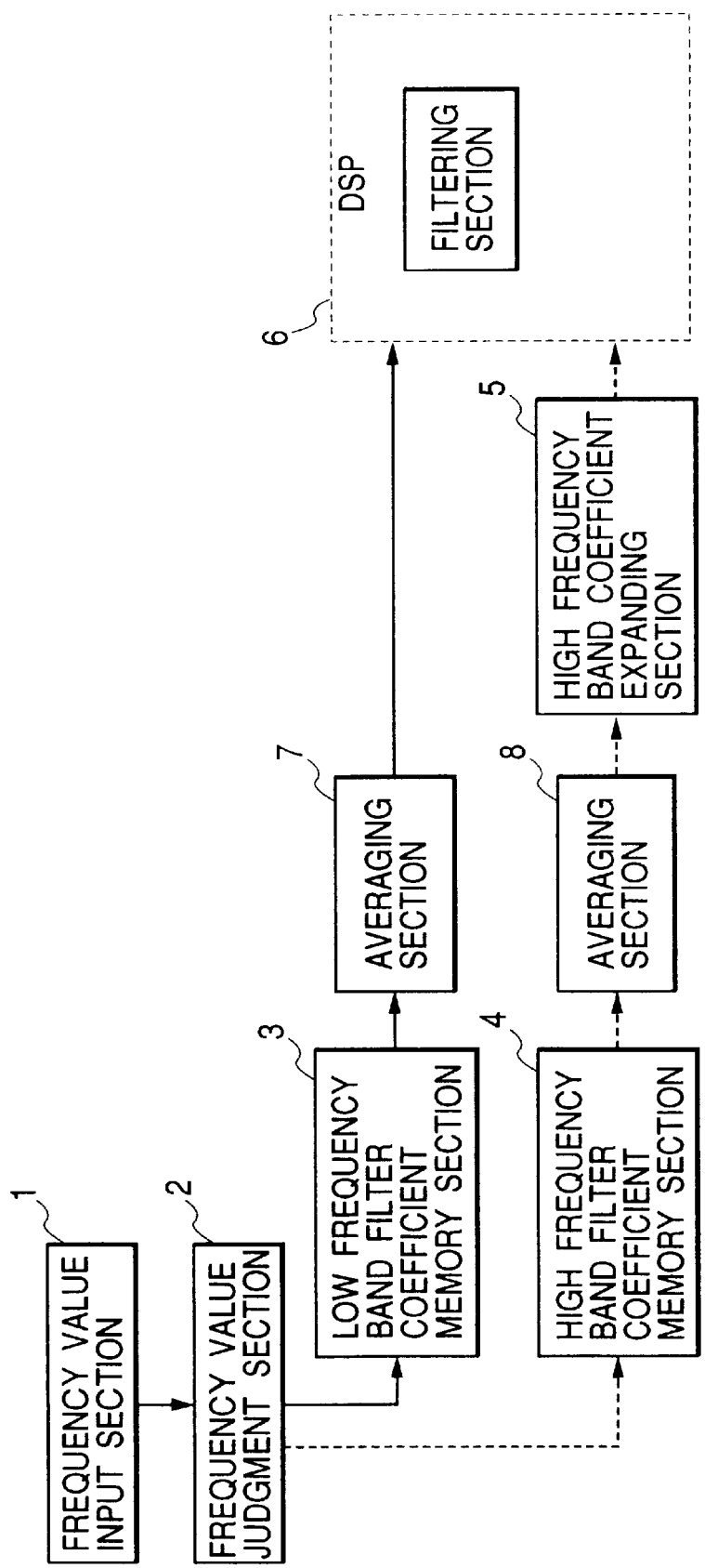
FIG. 9 is an operation flow diagram of a digital filter device according to a second embodiment of this invention.

FIG. 9 is an operation flow diagram of a digital filter device in the second embodiment of this invention. With reference to FIG. 9, an averaging section (interpolating section) 7 is provided between a memory section 3 and a filtering section 6. In addition, an averaging section (interpolating section) 8 is provided between a memory section 4 and a coefficient expanding section 5.

In the case where a desired lower-side cutoff frequency represented by a command signal is equal to none of cutoff frequencies assigned to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The averaging section 7 calculates mean filter coefficients between the filter coefficients in the first set and the filter coefficients in the second set. Specifically, the mean filter coefficients $b_0[\{(m-1)+m\}/2]$, $b_1[\{(m-1)+m\}/2]$, $b_2[\{(m-1)+m\}/2]$, $a_1[\{(m-1)+m\}/2]$, and $a_2[\{(m-1)+m\}/2]$ are expressed as follows.

$$b_0[\{(m-1)+m\}/2]=\{b_0(m-1)+b_0(m)\}/2 \quad (14)$$

$$b_1[\{(m-1)+m\}/2]=\{b_1(m-1)+b_1(m)\}/2 \quad (15)$$

$$b_2[\{(m-1)+m\}/2]=\{b_2(m-1)+b_2(m)\}/2 \quad (16)$$

$$a_1[\{(m-1)+m\}/2]=\{a_1(m-1)+a_1(m)\}/2 \quad (17)$$

$$a_2[\{(m-1)+m\}/2]=\{a_2(m-1)+a_2(m)\}/2 \quad (18)$$

where $b_0(m-1)$, $b_1(m-1)$, $b_2(m-1)$, $a_1(m-1)$, and $a_2(m-1)$ denote the filter coefficients in the first set, and $b_0(m)$, $b_1(m)$, $b_2(m)$, $a_1(m)$, and $a_2(m)$ denote the filter coefficients in the second set.

In the case where a desired higher-side cutoff frequency represented by a command signal is equal to none of cutoff frequencies assigned to respective sets of precalculated basic coefficients "α" and "β" in the memory section 4, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 4. The averaging section 8 calculates mean basic coefficients between the precalculated basic coefficients in the first set and the precalculated basic coefficients in the second set.

FIG. 10 shows sets of filter coefficients $a_1$, $a_2$, $b_0$, $b_1$, and $b_2$ which include sets of filter coefficients provided by the averaging section 7. As shown in FIG. 10, the filter coefficient $b_0$ assigned to a cutoff frequency Fc(m) of 21 Hz is equal to a mean between the filter coefficient $b_0$ assigned to a cutoff frequency Fc(m) of 20 Hz and the filter coefficient $b_0$ assigned to a cutoff frequency Fc(m) of 22.4 Hz. Also, each of the filter coefficients $b_1$, $b_2$, $a_1$, and $a_2$ assigned to a cutoff frequency Fc(m) of 21 Hz is equal to a similar mean. In addition, each of the filter coefficients assigned to a cutoff frequency Fc(m) of 24 Hz, . . . , or 85 Hz is equal to a similar mean.

FIG. 11 shows sets of basic coefficients "α" and "β" which include sets of basic coefficients provided by the averaging section 8. As shown in FIG. 11, the basic coefficient "α" assigned to a cutoff frequency Fc(k) of 105 Hz is equal to a mean between the basic coefficient "α" assigned to a cutoff frequency Fc(k) of 100 Hz and the basic coefficient "α" assigned to a cutoff frequency Fc(k) of 112 Hz. Also, the basic coefficient "β" assigned to a cutoff frequency Fc(k) of 105 Hz is equal to a similar mean. In addition, each of the basic coefficients assigned to a cutoff frequency Fc(k) of . . . 19.2 kHz is equal to a similar mean.

The averaging section 7 doubles the total number of different usable sets of filter coefficients $a_1$, $a_2$, $b_0$, $b_1$, and $b_2$ without increasing the capacity of the memory section 3. The averaging section 8 doubles the total number of different usable sets of basic filter coefficients "α" and "α" without increasing the capacity of the memory section 4.

Overall operation of the digital filter device in the second embodiment of this invention will be explained. A command signal representative of a desired cutoff frequency is fed via an input section 1 to a judgement section 2. The judgment section 2 decides whether the desired cutoff frequency represented by the command signal is in a low frequency band (20 Hz to 100 Hz) or a high frequency band (100 Hz to 20 kHz).

In the case where the desired cutoff frequency is in the low frequency band (20 Hz to 100 Hz), the judgment section 2 further decides whether or not the desired cutoff frequency is equal to one of cutoff frequencies corresponding to respective sets of filter coefficients $a_1$, $a_2$, $b_0$, $b_1$, and $b_2$ in the memory section 3.

When the desired cutoff frequency is equal to one of cutoff frequencies corresponding to respective sets of filter coefficients $a_1$, $a_2$, $b_0$, $b_1$, and $b_2$ in the memory section 3, a signal of a set of filter coefficients $a_1$, $a_2$, $b_0$, $b_1$, and $b_2$ which corresponds to the desired cutoff frequency is read out from the memory section 3 through a table look-up process. Then, the signal of the set of the filter coefficients $a_1$, $a_2$, $b_0$, $b_1$, and $b_2$ is transmitted through the averaging section 7, and is written into a first section of a memory within the filtering section 6 which is assigned to a lower-side cutoff frequency. As a result, the actual lower-side cutoff frequency of the filtering section 6 is set or equalized to the desired cutoff frequency represented by the command signal.

When the desired cutoff frequency is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The signal of the first set of the filter coefficients and the signal of the second set of the filter coefficients are fed to the averaging section 7. The averaging section 7 calculates mean filter coefficients between the filter coefficients in the first set and the filter coefficients in the second set. Then, a signal of a set of the calculated mean filter coefficients $a_1$, $a_2$, $b_0$, $b_1$, and $b_2$ is written into the first section of the memory within the filtering section 6. As a result, the actual lower-side cutoff frequency of the filtering section 6 is substantially set or equalized to the desired cutoff frequency represented by the command signal.

In the case where the desired cutoff frequency is in the high frequency band (100 Hz to 20 kHz), the judgment section 2 further decides whether or not the desired cutoff frequency is equal to one of cutoff frequencies corresponding to respective sets of precalculated basic coefficients "α" and "α" in the memory section 4.

When the desired cutoff frequency is equal to one of cutoff frequencies corresponding to respective sets of precalculated basic coefficients "α" and "β" in the memory section 4, a signal of a set of precalculated basic coefficients "α" and "β" assigned to the desired cutoff frequency is read out from the memory section 4 through a table look-up process. In addition, a signal of a PKG gain and a signal of a PKG Q factor may be read out from the memory section 4. Then, the read-out signal of the set of the precalculated basic coefficients "α" and "β", the read-out signal of the PKG gain, and the read-out signal of the PKG Q factor are transmitted through the averaging section 8, and are fed to the coefficient expanding section 5. The coefficient expanding section 5 calculates a set of final filter coefficients $a_1$, $a_2$, $b_0$, $b_1$, and $b_2$ from the set of the precalculated basic coefficients "α" and "β", the PKG gain, and the PKG g factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The expansion equations include the equations (7)–(11). The coefficient expanding section 5 generates a signal of the calculated set of the final filter coefficients $a_1$, $a_2$, $b_0$, $b_{and\ b2}$. Then, the signal of the set of the final filter coefficients $a_1$, $a_2$, $b_0$, $b_1$, and $b_2$ is written into a second section of the memory within the filtering section 6 which is assigned to a higher-side cutoff frequency. As a result, the actual higher-side cutoff frequency of the filtering section 6 is set or equalized to the desired cutoff frequency represented by the command signal.

When the desired cutoff frequency is equal to none of cutoff frequencies corresponding to respective sets of precalculated basic coefficients "α" and "β" in the memory section 4, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 4. The signal of the first set of the precalculated basic coefficients and the signal of the second set of the precalculated basic coefficients are fed to the averaging section 8. The averaging section 8 calculates mean basic coefficients between the basic coefficients in the first set and the basic coefficients in the second set. Then, a signal of a set of the calculated mean basic coefficients "α" and "β" is fed to the coefficient expanding section 5. In addition, the signal of the PKG gain and the signal of the PKG Q factor may be read out from the memory section 4 before being fed to the coefficient expanding section 5 through the averaging section 8. The coefficient expanding section 5 calculates a set of final filter coefficients $a_1$, $a_2$, $b_0$, $b_1$, and $b_2$ from the set of the mean basic coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from basic coefficients "α" and "β", a Q factor, and a gain "k". The expansion equations include the equations (7)–(11). The coefficient expanding section 5 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into the second section of the memory within the filtering section 6. As a result, the actual higher-side cutoff frequency of the filtering section 6 is substantially set or equalized to the desired cutoff frequency represented by the command signal.

As previously explained, the averaging section 7 doubles the total number of different usable sets of filter coefficients $a_1$, $a_2$, $b_0$, $b_1$, and $b_2$ without increasing the capacity of the memory section 3. The averaging section 8 doubles the total number of different usable sets of basic coefficients "α" and "β" without increasing the capacity of the memory section 4.

Third Embodiment

A third embodiment of this invention is similar to the first embodiment (FIGS. 4–8) thereof except for design changes indicated hereinafter.

Figure 12:
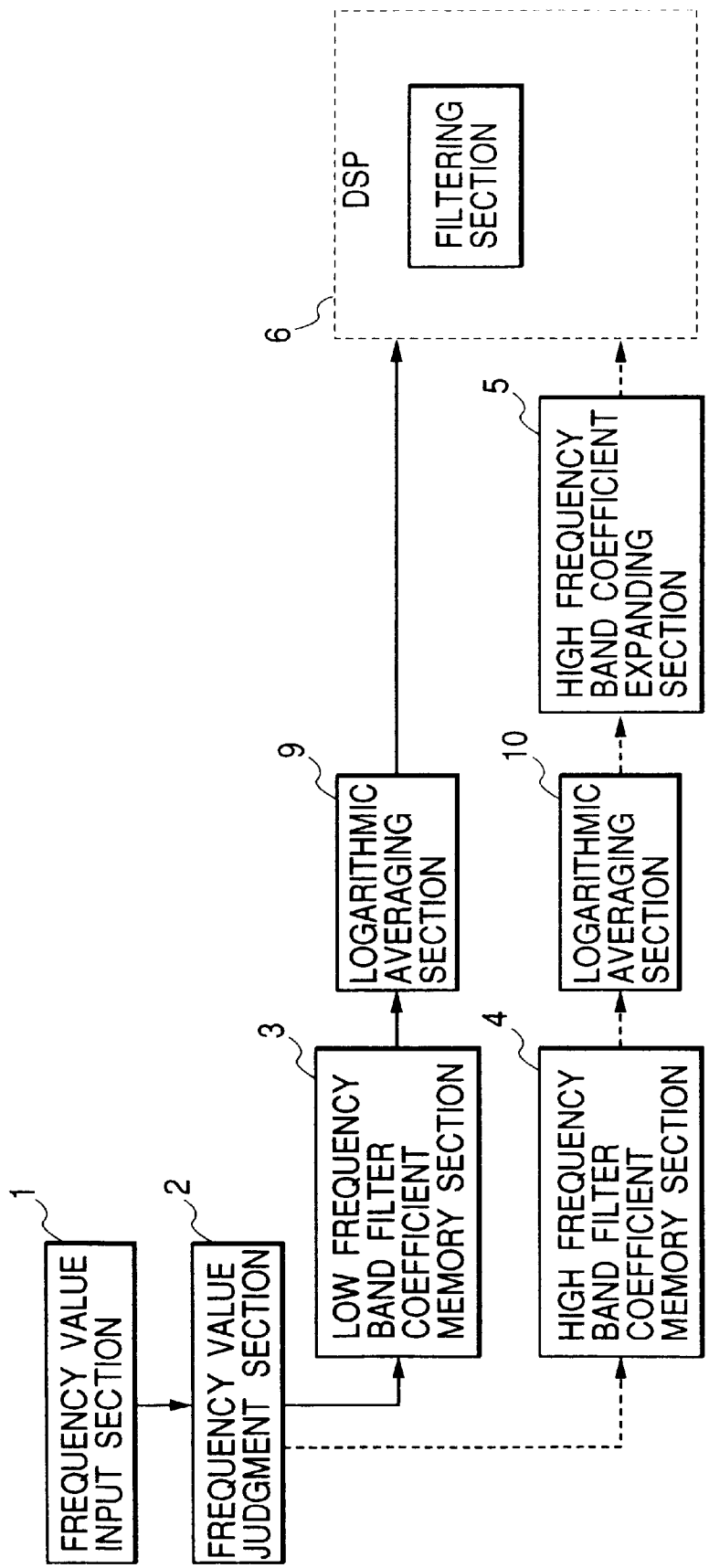
FIG. 12 is an operation flow diagram of a digital filter device according to a third embodiment of this invention.

FIG. 12 is an operation flow diagram of a digital filter device in the third embodiment of this invention. With reference to FIG. 12, a logarithmically averaging section (logarithmically interpolating section) 9 is provided between a memory section 3 and a filtering section 6. In addition, a logarithmically averaging section (logarithmically interpolating section) 10 is provided between a memory section 4 and a coefficient expanding section 5.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The logarithmically averaging section 9 calculates mean filter coefficients between the filter coefficients in the first set and the filter coefficients in the second set according to a logarithmically averaging process. Specifically, the mean filter coefficients $b_0[\{(m-1)+m\}/2]$, $b_1[\{(m-1)+m\}/2]$, $b_2[\{(m-1)+m\}/2]$, $a_1[\{(m-1)+m\}/2]$, and $a_2[\{(m-1)+m\}/2]$ are expressed as follows.

$$b_0[\{(m-1)+m\}/2]=\log\{b_0(m-1)\cdot b_0(m)\}/2 \tag{19}$$

$$b_1[\{(m-1)+m\}/2]=\log\{b_1(m-1)\cdot b_1(m)\}/2 \tag{20}$$

$$b_2[\{(m-1)+m\}/2]=\log\{b_2(m-1)\cdot b_2(m)\}/2 \tag{21}$$

$$a_1[\{(m-1)+m\}/2]=\log\{a_1(m-1)\cdot a_1(m)\}/2 \tag{22}$$

$$a_2[\{(m-1)+m\}/2]=\log\{a_2(m-1)\cdot a_2(m)\}/2 \tag{23}$$

where $b_0(m-1)$, $b_1(m-1)$, $b_2(m-1)$, $a_1(m-1)$, and $a_2(m-1)$ denote the filter coefficients in the first set, and $b_0(m)$, $b_1(m)$, $b_2(m)$, $a_1(m)$, and $a_2(m)$ denote the filter coefficients in the second set.

In the case where a desired higher-side cutoff frequency represented by a command signal is equal to none of cutoff frequencies corresponding to respective sets of precalculated basic coefficients "α" and "β" in the memory section 4, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 4. The logarithmically averaging section 10 calculates mean basic coefficients between the basic coefficients in the first set and the basic coefficients in the second set according to the logarithmically averaging process. Specifically, the mean basic coefficients $\alpha[\{(m-1)+m\}/2]$ and $\beta[\{(m-1)+m\}/2]$ are expressed as follows.

$$\alpha[\{(m-1)+m\}/2]=\log\{\alpha(m-1)\cdot\alpha(m)\}/2 \quad (24)$$

$$\beta[\{(m-1)+m\}/2]=\log\{\beta(m-1)\cdot\beta(m)\}/2 \quad (25)$$

where $\alpha(m-1)$ and $\beta(m-1)$ denote the precalculated basic coefficients in the first set, and $\alpha(m)$ and $\beta(m)$ denote the precalculated basic coefficients in the second set.

The logarithmically averaging section 9 doubles the total number of different usable sets of filter coefficients $a_1$, $a_2$, $b_0$, $b_1$, and $b_2$ without increasing the capacity of the memory section 3. The logarithmically averaging section 10 doubles the total number of different usable sets of basic coefficients "α" and "β" without increasing the capacity of the memory section 4. The logarithmically averaging processes implemented by the logarithmically averaging sections 9 and 10 provide a good auditory sensation about a change of cutoff frequencies of the filtering section 6.

Overall operation of the digital filter device in the third embodiment of this invention will be explained. A command signal representative of a desired cutoff frequency is fed via an input section 1 to a judgement section 2. The judgment section 2 decides whether the desired cutoff frequency represented by the command signal is in a low frequency band (20 Hz to 100 Hz) or a high frequency band (100 Hz to 20 kHz).

In the case where the desired cutoff frequency is in the low frequency band (20 Hz to 100 Hz), the judgment section 2 further decides whether or not the desired cutoff frequency is equal to one of cutoff frequencies corresponding to respective sets of filter coefficients $a_1$, $a_2$, $b_0$, $b_1$, and $b_2$ in the memory section 3.

When the desired cutoff frequency is equal to one of cutoff frequencies corresponding to respective sets of filter coefficients $a_1$, $a_2$, $b_0$, $b_1$, and $b_2$ in the memory section 3, a signal of a set of filter coefficients $a_1$, $a_2$, $b_0$, $b_1$, and $b_2$ which corresponds to the desired cutoff frequency is read out from the memory section 3 through a table look-up process. Then, the signal of the set of the filter coefficients $a_1$, $a_2$, $b_0$, $b_1$, and $b_2$ is transmitted through the logarithmically averaging section 9, and is written into a first section of a memory within the filtering section 6 which is assigned to a lower-side cutoff frequency. As a result, the actual lower-side cutoff frequency of the filtering section 6 is set or equalized to the desired cutoff frequency represented by the command signal.

When the desired cutoff frequency is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The signal of the first set of the filter coefficients and the signal of the second set of the filter coefficients are fed to the logarithmically averaging section 9. The logarithmically averaging section 9 calculates mean filter coefficients between the filter coefficients in the first set and the filter coefficients in the second set according to the logarithmically averaging process. Then, a signal of a set of the calculated mean filter coefficients $a_1$, $a_2$, $b_0$, $b_1$, and $b_2$ is written into the first section of the memory within the filtering section 6. As a result, the actual lower-side cutoff frequency of the filtering section 6 is substantially set or equalized to the desired cutoff frequency represented by the command signal.

In the case where the desired cutoff frequency is in the high frequency band (100 Hz to 20 kHz), the judgment section 2 further decides whether or not the desired cutoff frequency is equal to one of cutoff frequencies corresponding to respective sets of precalculated basic coefficients "α" and "β" in the memory section 4.

When the desired cutoff frequency is equal to one of cutoff frequencies corresponding to respective sets of precalculated basic coefficients "α" and "β" in the memory section 4, a signal of a set of precalculated basic coefficients "α" and "β" assigned to the desired cutoff frequency is read out from the memory section 4 through a table look-up process. In addition, a signal of a PKG gain and a signal of a PKG Q factor may be read out from the memory section 4. Then, the read-out signal of the set of the precalculated basic coefficients "α" and "β", the read-out signal of the PKG gain, and the read-out signal of the PKG Q factor are transmitted through the logarithmically averaging section 10, and are fed to the coefficient expanding section 5. The coefficient expanding section 5 calculates a set of final filter coefficients $a_1$, $a_2$, $b_0$, $b_1$, and $b_2$ from the set of the precalculated basic filter coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The expansion equations include the equations (7)–(11). The coefficient expanding section 5 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into a second section of the memory within the filtering section 6 which is assigned to a higher-side cutoff frequency. As a result, the actual higher-side cutoff frequency of the filtering section 6 is set or equalized to the desired cutoff frequency represented by the command signal.

When the desired cutoff frequency is equal to none of cutoff frequencies corresponding to respective sets of precalculated basic coefficients "α" and "β" in the memory section 4, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 4. The signal of the first set of the precalculated basic coefficients and the signal of the second set of the precalculated basic coefficients are fed to the logarithmically averaging section 10. The logarithmically averaging section 10 calculates mean basic coefficients between the basic coefficients in the first set and the basic coefficients in the second set according to the logarithmically averaging process. Then, a signal of a set of the calculated mean basic coefficients "α" and "β" is fed to the coefficient expanding section 5. In addition, the signal of the PKG gain and the signal of the PKG Q factor may be read out from the memory section 4 before being fed to the coefficient expanding section 5 through the logarithmically averaging section 10. The coefficient expanding section 5 calculates a set of final filter coefficients $a_1$, $a_2$, $b_0$, $b_1$, and $b_2$ from the set of the mean basic coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from basic coefficients "α" and "β", a Q factor, and a gain "k". The expansion equations include the equations (7)–(11). The coefficient expanding section 5 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into the second section of the memory within the filtering section 6. As a result, the actual higher-side cutoff frequency of the filtering section 6 is substantially set or equalized to the desired cutoff frequency represented by the command signal.

As previously explained, the logarithmically averaging processes implemented by the logarithmically averaging sections 9 and 10 provide a good auditory sensation about a change of cutoff frequencies of the filtering section 6.

Fourth Embodiment

A fourth embodiment of this invention is similar to the first embodiment (FIGS. 4–8) thereof except for design changes indicated hereinafter.

Figure 13:
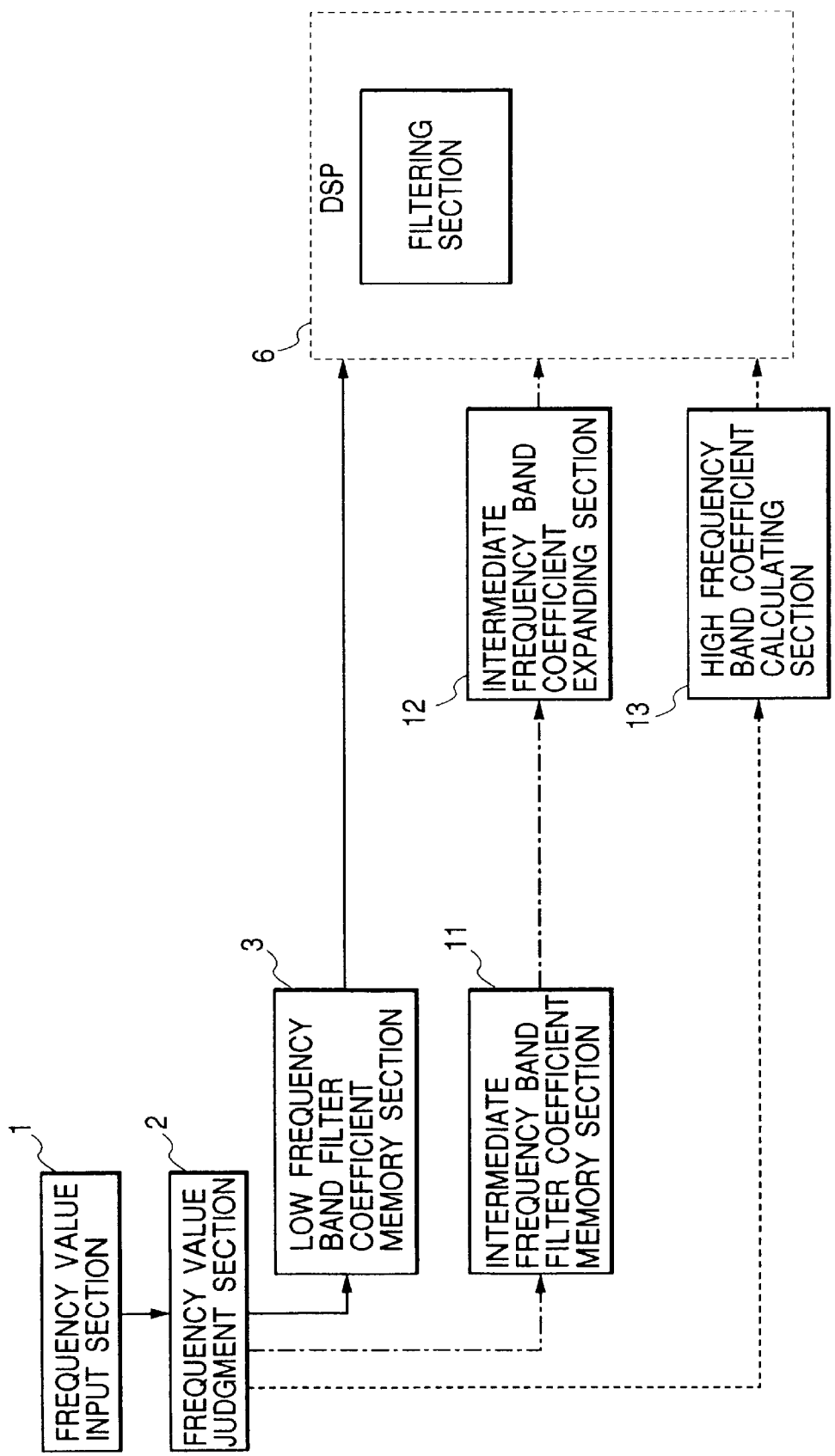
FIG. 13 is an operation flow diagram of a digital filter device according to a fourth embodiment of this invention.

FIG. 13 is an operation flow diagram of a digital filter device in the fourth embodiment of this invention. With reference to FIG. 13, a memory section 11 and a coefficient expanding section 5 are provided between a judgment section 2 and a filtering section 6. In addition, a calculating section 13 is provided between the judgment section 2 and the filtering section 6.

In the fourth embodiment of this invention, the frequency range in which the cutoff frequencies of the filtering section 6 (that is, the cutoff frequencies of a PKG) vary is separated into a predetermined low frequency band, a predetermined intermediate frequency band, and a predetermined high frequency band. The low frequency band is lower in frequency than the intermediate frequency band. The intermediate frequency band is lower in frequency than the high frequency band.

The memory section 11 stores signals of sets of precalculated basic coefficients "α" and "β" (see the equations (12) and (13)) which correspond to different cutoff frequencies in the intermediate frequency band, respectively. The memory section 11 is followed by the coefficient expanding section 12.

The coefficient expanding section 12 calculates a set of final filter coefficients $a_1$, $a_2$, $b_0$, $b_1$, and $b_2$ from the set of the precalculated basic filter coefficients "α" and "β", a Q factor, and a gain "k" according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The Q factor and the gain "k" may be preset or variable. Information of the Q factor and the gain "k" may be fed from an external device (not shown). The coefficient expanding section 12 generates a signal of the calculated set of the final filter coefficients $a_1$, $a_2$, $b_0$, $b_1$, and $b_2$.

The calculating section 13 computes a set of filter coefficients $a_1$, $a_2$, $b_0$, $b_1$, and $b_2$ from a desired cutoff frequency, a Q factor, and a gain "k" according to a predetermined coefficient calculation algorithm. The Q factor and the gain "k" may be preset or variable. Information of the Q factor and the gain "k" may be fed from an external device (not shown). The calculating section 13 generates a signal of the calculated set of the coefficients $a_1$, $a_2$, $b_0$, $b_1$, and $b_2$. Overall operation of the digital filter device in the fourth embodiment of this invention will be explained. A command signal representative of a desired cutoff frequency is fed via an input section 1 to the judgement section 2. The judgment section 2 decides which of the low frequency band, the intermediate frequency band, and the high frequency band the desired cutoff frequency represented by the command signal exists in.

In the case where the judgment section 2 decides that the desired cutoff frequency is in the low frequency band, a memory section 3 is accessed in response to the desired cutoff frequency so that a signal of a set of filter coefficients $a_1$, $a_2$, $b_0$, $b_1$, and $b_2$ which corresponds to the desired cutoff frequency is read out therefrom through a table look-up process. Then, the signal of the set of the filter coefficients $a_1$, $a_2$, $b_0$, $b_1$, and $b_2$ is written into a first section of a memory within the filtering section 6 which is assigned to a lower-side cutoff frequency. As a result, the actual lower-side cutoff frequency of the filtering section 6 is set or equalized to the desired cutoff frequency represented by the command signal.

In the case where the judgment section 2 decides that the desired cutoff frequency is in the intermediate frequency band, the memory section 11 is accessed in response to the desired cutoff frequency so that a signal of a set of precalculated basic coefficients "α" and "β" which corresponds to the desired cutoff frequency is read out therefrom through a table look-up process. In addition, a signal of a PKG gain and a signal of a PKG Q factor may be read out from the memory section 11. Then, the read-out signal of the set of the precalculated basic coefficients "α" and "β", the read-out signal of the PKG gain, and the read-out signal of the PKG Q factor are fed to the coefficient expanding section 12. The coefficient expanding section 12 calculates a set of final filter coefficients $a_1$, $a_2$, $b_0$, $b_1$, and $b_2$ from the set of the precalculated basic filter coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The expansion equations include the equations (7)–(11). The coefficient expanding section 12 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into a second section of the memory within the filtering section 6 which is assigned to an intermediate/higher-side cutoff frequency. As a result, the actual intermediate/higher-side cutoff frequency of the filtering section 6 is set or equalized to the desired cutoff frequency represented by the command signal.

In the case where the judgment section 2 decides that the desired cutoff frequency is in the high frequency band, the judgment section 2 informs the calculating section 13 of the desired cutoff frequency. In addition, a signal of a gain "k" and a signal of a Q factor are fed to the calculating section 13. Then, the calculating section 13 computes a set of filter coefficients $a_1$, $a_2$, $b_0$, $b_1$, and $b_2$ from the desired cutoff frequency, the Q factor, and the gain "k" according to a predetermined coefficient calculation algorithm. The Q factor and the gain "k" may be preset or variable. Information of the Q factor and the gain "k" may be fed from an external device (not shown). The calculating section 13 generates a signal of the calculated set of the coefficients $a_1$, $a_2$, $b_0$, $b_1$, and $b_2$. Subsequently, the signal of the calculated set of the filter coefficients $a_1$, $a_2$, $b_0$, $b_1$, and $b_2$ is written into the second section of the memory within the filtering section 6. As a result, the actual intermediate/higher-side cutoff frequency of the filtering section 6 is set or equalized to the desired cutoff frequency represented by the command signal.

As previously mentioned, when the desired cutoff frequency represented by the command signal is in the low frequency band, filter coefficients to be set in the filtering section 6 are determined by the table look-up process in which the memory section 3 is accessed. Thus, it is possible to prevent the occurrence of errors in the filter coefficients set in the filtering section 6 which might be caused by a calculation process. Accordingly, the filtering section 6 can implement an accurate filtering process. In addition, it is possible to reduce an amount of calculation work.

On the other hand, when the desired cutoff frequency represented by the command signal is in the intermediate frequency band, filter coefficients to be set in the filtering section 6 are determined by the table look-up process accessing the memory section 11 and also the coefficient expansion process using the common terms (the equations (12) and (13)) in the coefficient-representing equations (7)-(11). The coefficient expansion process makes it sufficient that the memory section 11 has a small capacity.

When the desired cutoff frequency represented by the command signal is in the high frequency band, filter coefficients to be set in the filtering section 6 are determined by the fully calculation process. Accordingly, it is unnecessary to provide a ROM storing signals of sets of filter coefficients for cutoff frequencies in the high frequency band.

Fifth Embodiment

A fifth embodiment of this invention is similar to the fourth embodiment (FIG. 13) thereof except for design changes indicated hereinafter.

Figure 14:
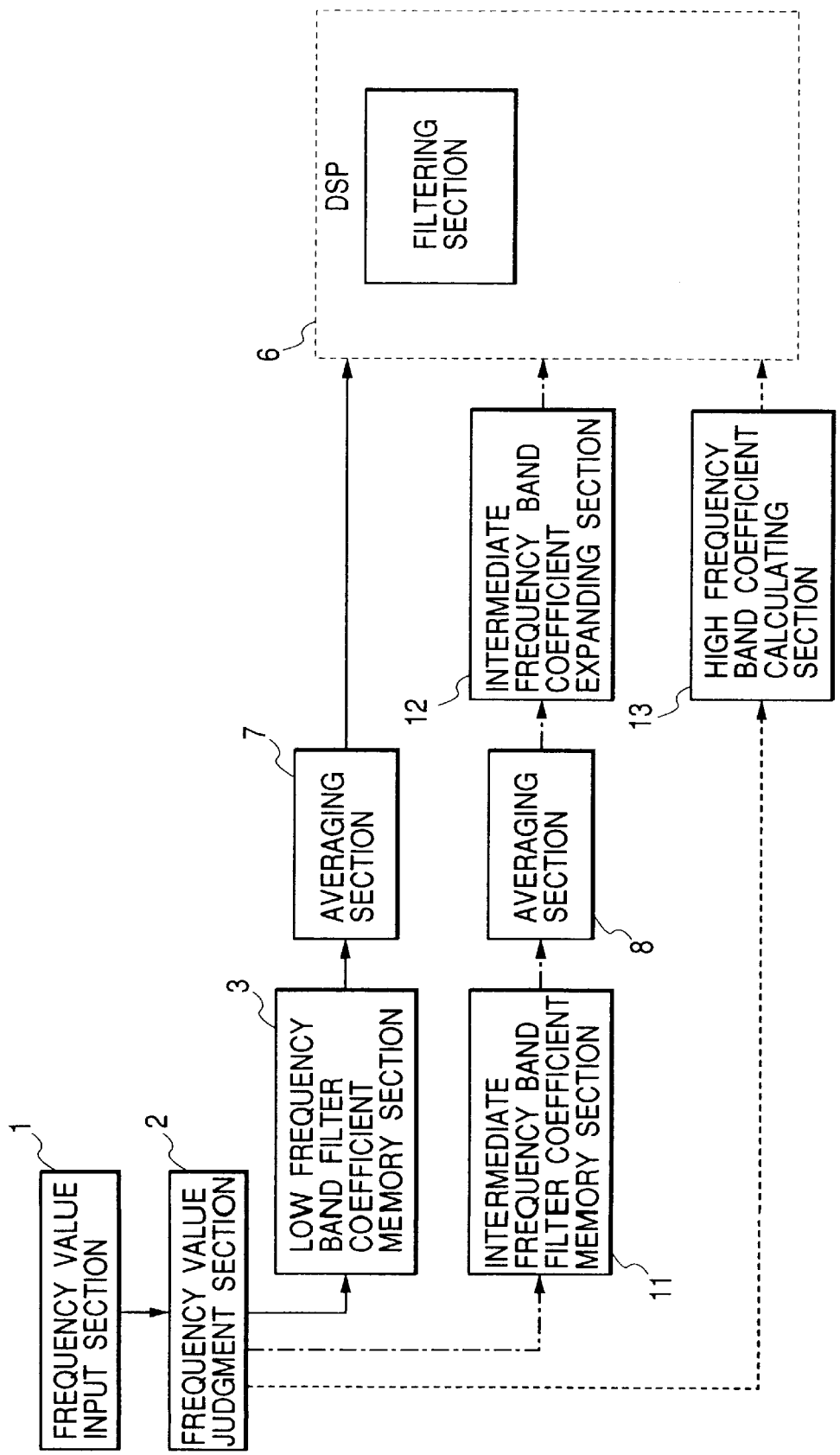
FIG. 14 is an operation flow diagram of a digital filter device according to a fifth embodiment of this invention.

FIG. 14 is an operation flow diagram of a digital filter device in the fifth embodiment of this invention. With reference to FIG. 14, an averaging section (interpolating section) 7 is provided between a memory section 3 and a filtering section 6. In addition, an averaging section (interpolating section) 8 is provided between a memory section 11 and a coefficient expanding section 12. The averaging sections 7 and 8 are similar to those in FIG. 9.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The averaging section 7 calculates mean filter coefficients between the filter coefficients in the first set and the filter coefficients in the second set.

In the case where a desired intermediate cutoff frequency represented by a command signal is equal to none of cutoff frequencies corresponding to respective sets of precalculated basic filter coefficients "α" and "α" in the memory section 11, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 11. The averaging section 8 calculates mean basic coefficients between the basic coefficients in the first set and the basic coefficients in the second set.

Operation of the digital filter device in the fifth embodiment of this invention will be explained. A command signal representative of a desired cutoff frequency is fed via an input section 1 to a judgement section 2. The judgment section 2 decides which of a predetermined low frequency band, a predetermined intermediate frequency band, and a predetermined high frequency band the desired cutoff frequency represented by the command signal exists in.

In the case where the desired cutoff frequency is in the low frequency band, the judgment section 2 further decides whether or not the desired cutoff frequency is equal to one of cutoff frequencies corresponding to respective sets of filter coefficients $a_1$, $a_2$, $b_0$, $b_1$, and $b_2$ in the memory section 3.

When the desired cutoff frequency is equal to one of cutoff frequencies corresponding to respective sets of filter coefficients $a_1$, $a_2$, $b_0$, $b_1$, and $b_2$ in the memory section 3, a signal of a set of filter coefficients $a_1$, $a_2$, $b_0$, $b_1$, and $b_2$ which corresponds to the desired cutoff frequency is read out from the memory section 3 through a table look-up process. Then, the signal of the set of the filter coefficients $a_1$, $a_2$, $b_0$, $b_1$, and $b_2$ is transmitted through the averaging section 7, and is written into a first section of a memory within the filtering section 6 which is assigned to a lower-side cutoff frequency. As a result, the actual lower-side cutoff frequency of the filtering section 6 is set or equalized to the desired cutoff frequency represented by the command signal.

When the desired cutoff frequency is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The signal of the first set of the filter coefficients and the signal of the second set of the filter coefficients are fed to the averaging section 7. The averaging section 7 calculates mean filter coefficients between the filter coefficients in the first set and the filter coefficients in the second set. Then, a signal of a set of the calculated mean filter coefficients $a_1$, $a_2$, $b_0$, $b_1$, and $b_2$ is written into the first section of the memory within the filtering section 6. As a result, the actual lower-side cutoff frequency of the filtering section 6 is substantially set or equalized to the desired cutoff frequency represented by the command signal.

In the case where the desired cutoff frequency is in the intermediate frequency band, the judgment section 2 further decides whether or not the desired cutoff frequency is equal to one of cutoff frequencies corresponding to respective sets of precalculated basic coefficients "α" and "α" in the memory section 11.

When the desired cutoff frequency is equal to one of cutoff frequencies corresponding to respective sets of precalculated basic coefficients "α" and "β" in the memory section 11, a signal of a set of precalculated basic coefficients "α" and "β" which corresponds to the desired cutoff frequency is read out from the memory section 11 through a table look-up process. In addition, a signal of a PKG gain and a signal of a PKG Q factor may be read out from the memory section 11. Then, the read-out signal of the set of the precalculated basic coefficients "α" and "β", the read-out signal of the PKG gain, and the read-out signal of the PKG Q factor are transmitted through the averaging section 8, and are fed to the coefficient expanding section 12. The coefficient expanding section 12 calculates a set of final filter coefficients $a_1$, $a_2$, $b_0$, $b_1$, and $b_2$ from the set of the precalculated basic filter coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The expansion equations include the equations (7)–(11). The coefficient expanding section 12 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into a second section of the memory within the filtering section 6 which is assigned to an intermediate/ higher-side cutoff frequency. As a result, the actual intermediate/higher-side cutoff frequency of the filtering section 6 is set or equalized to the desired cutoff frequency represented by the command signal.

When the desired cutoff frequency is equal to none of cutoff frequencies corresponding to respective sets of precalculated basic coefficients "α" and "β" in the memory section 11, an interpolation process is implemented as follows. A signal of a first set of precalculated basic coefficients assigned to a cutoff frequency immediately below the desired -cutoff frequency and a signal of a second set of precalculated basic coefficients assigned to a cutoff frequency immediately above the desired cutoff frequency are read out from the memory section 11. The signal of the first set of the precalculated basic coefficients and the signal of the second set of the precalculated basic coefficients are fed to the averaging section 8. The averaging section 8 calculates mean basic coefficients between the basic coefficients in the first set and the basic coefficients in the second set. Then, a signal of a set of the calculated mean basic coefficients "α" and "≈" is fed to the coefficient expanding section 12. In addition, the signal of the PKG gain and the signal of the PKG Q factor may be read out from the memory section 11 before being fed to the coefficient expanding section 12 through the averaging section 8. The coefficient expanding section 12 calculates a set of final filter coefficients $a_1$, $a_2$, $b_0$, $b_1$, and $b_2$ from the set of the mean basic coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from basic coefficients "α" and "β", a Q factor, and a gain "k". The expansion equations include the equations (7)–(11). The coefficient expanding section 12 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into the second section of the memory within the filtering section 6. As a result, the actual intermediate/higher-side cutoff frequency of the filtering section 6 is substantially set or equalized to the desired cutoff frequency represented by the command signal.

The averaging section 7 doubles the total number of different usable sets of filter coefficients $a_1$, $a_2$, $b_0$, $b_1$, and $b_2$ without increasing the capacity of the memory section 3. The averaging section 8 doubles the total number of different usable sets of basic coefficients "α" and "β" without increasing the capacity of the memory section 11.

Sixth Embodiment

A sixth embodiment of this invention is similar to the fourth embodiment (FIG. 13) thereof except for design changes indicated hereinafter.

Figure 15:
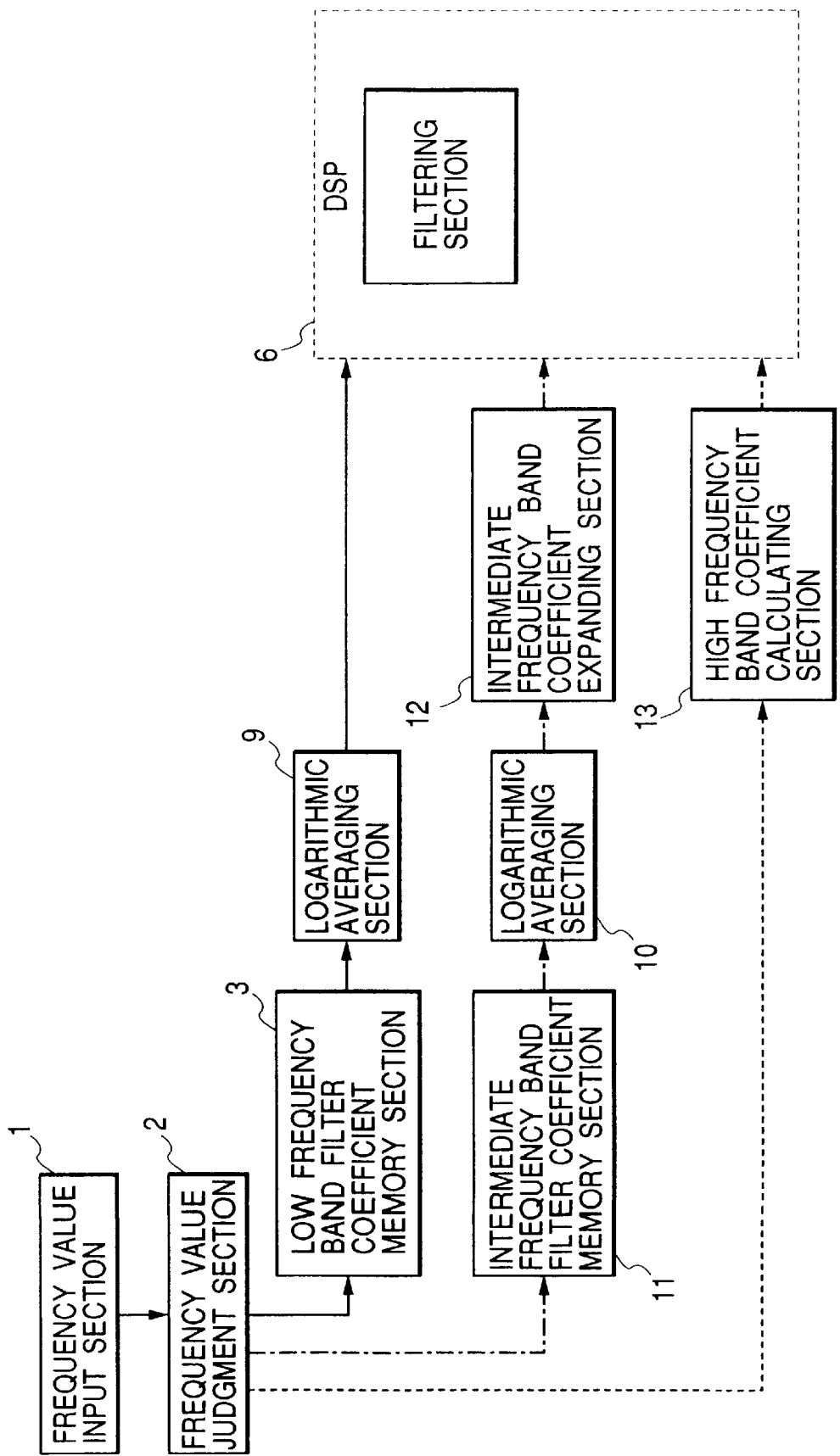
FIG. 15 is an operation flow diagram of a digital filter device according to a sixth embodiment of this invention.

FIG. 15 is an operation flow diagram of a digital filter device in the sixth embodiment of this invention. With reference to FIG. 15, a logarithmically averaging section (logarithmically interpolating section) 9 is provided between a memory section 3 and a filtering section 6. In addition, a logarithmically averaging section (logarithmically interpolating section) 10 is provided between a memory section 11 and a coefficient expanding section 12. The logarithmically averaging sections 9 and 10 are similar to those in FIG. 12.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The logarithmically averaging section 9 calculates mean filter coefficients between the filter coefficients in the first set and the filter coefficients in the second set according to a logarithmically averaging process.

In the case where a desired intermediate cutoff frequency represented by a command signal is equal to none of cutoff frequencies corresponding to respective sets of precalculated basic filter coefficients "α" and "β" in the memory section 11, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 11. The logarithmically averaging section 10 calculates mean basic coefficients between the basic coefficients in the first set and the basic coefficients in the second set according to the logarithmically averaging process.

Operation of the digital filter device in the sixth embodiment of this invention will be explained. A command signal representative of a desired cutoff frequency is fed via an input section 1 to a judgement section 2. The judgment section 2 decides which of a predetermined low frequency band, a predetermined intermediate frequency band, and a predetermined high frequency band the desired cutoff frequency represented by the command signal exists in.

In the case where the desired cutoff frequency is in the low frequency band, the judgment section 2 further decides whether or not the desired cutoff frequency is equal to one of cutoff frequencies corresponding to respective sets of filter coefficients $a_1$, $a_2$, $b_0$, $b_1$, and $b_2$ in the memory section 3.

When the desired cutoff frequency is equal to one of cutoff frequencies corresponding to respective sets of filter coefficients $a_1$, $a_2$, $b_0$, $b_1$, and $b_2$ in the memory section 3, a signal of a set of filter coefficients $a_1$, $a_2$, $b_0$, $b_1$, and $b_2$ which corresponds to the desired cutoff frequency is read out from the memory section 3 through a table look-up process. Then, the signal of the set of the filter coefficients $a_1$, $a_2$, $b_0$, $b_1$, and $b_2$ is transmitted through the logarithmically averaging section 9, and is written into a first section of a memory within the filtering section 6 which is assigned to a lower-side cutoff frequency. As a result, the actual lower-side cutoff frequency of the filtering section 6 is set or equalized to the desired cutoff frequency represented by the command signal.

When the desired cutoff frequency is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The signal of the first set of the filter coefficients and the signal of the second set of the filter coefficients are fed to the logarithmically averaging section 9. The logarithmically averaging section 9 calculates mean filter coefficients between the filter coefficients in the first set and the filter coefficients in the second set according to the logarithmically averaging process. Then, a signal of a set of the calculated mean filter coefficients $a_1$, $a_2$, $b_0$, $b_1$, and $b_2$ is written into the first section of the memory within the filtering section 6. As a result, the actual lower-side cutoff frequency of the filtering section 6 is substantially set or equalized to the desired cutoff frequency represented by the command signal.

In the case where the desired cutoff frequency is in the intermediate frequency band, the judgment section 2 further decides whether or not the desired cutoff frequency is equal to one of cutoff frequencies corresponding to respective sets of precalculated basic coefficients "α" and "β" in the memory section 11.

When the desired cutoff frequency is equal to one of cutoff frequencies corresponding to respective sets of precalculated basic coefficients "α" and "β" in the memory section 11, a signal of a set of precalculated basic coefficients "α" and "β" which corresponds to the desired cutoff frequency is read out from the memory section through a table look-up process. In addition, a signal of a PKG gain and a signal of a PKG g factor may be read out from the memory section 11. Then, the read-out signal of the set of the precalculated basic coefficients "α" and "β", the read-out signal of the PKG gain, and the read-out signal of the PKG Q factor are transmitted through the logarithmically averaging section 10, and are fed to the coefficient expanding section 12. The coefficient expanding section 12 calculates a set of final filter coefficients $a_1$, $a_2$, $b_0$, $b_1$, and $b_2$ from the set of the precalculated basic filter coefficients "α" and "β", the PKG gain, and the PKG Q factor according to a predetermined coefficient expansion algorithm. The predetermined coefficient expansion algorithm uses the previously-mentioned expansion equations for calculating final filter coefficients $a_1$, $a_2$, $b_0$, $b_1$, and $b_2$ from precalculated basic coefficients "α" and "β", a Q factor, and a gain "k". The expansion equations include the equations (7)–(11). The coefficient expanding section 12 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into a second section of the memory within the filtering section 6 which is assigned to an intermediate/higher-side cutoff frequency. As a result, the actual intermediate/higher-side cutoff frequency of the filtering section 6 is set or equalized to the desired cutoff frequency represented by the command signal.

When the desired cutoff frequency is equal to none of cutoff frequencies corresponding to respective sets of precalculated basic coefficients "α" and "β" in the memory section 11, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 11. The signal of the first set of the precalculated basic coefficients and the signal of the second set of the precalculated basic coefficients are fed to the logarithmically averaging section 10. The logarithmically averaging section 10 calculates mean basic coefficients between the basic coefficients in the first set and the basic coefficients in the second set according to the logarithmically averaging process. Then, a signal of a set of the calculated mean basic coefficients "α" and "β" is fed to the coefficient expanding section 12. In addition, the signal of the PKG gain and the signal of the PKG Q factor may be read out from the memory section 11 before being fed to the coefficient expanding section 12 through the logarithmically averaging section 10. The coefficient expanding section 12 calculates a set of final filter coefficients $a_1$, $a_2$, $b_0$, $b_1$, and $b_2$ from the set of the mean basic filter coefficients "α" and "β", the PKG gain, and the PKG Q factor according to a predetermined coefficient expansion algorithm. The predetermined coefficient expansion algorithm uses the previously5 mentioned expansion equations for calculating final filter coefficients $a_1$, $a_2$, $b_0$, $b_1$, and $b_2$ from basic coefficients "α" and "β", a Q factor, and a gain "k". The expansion equations include the equations (7)–(11). The coefficient expanding section 12 generates a signal of the calculated set of the final filter coefficients $a_1$, $a_2$, $b_0$, $b_1$, and $b_2$. Then, the signal of the set of the final filter coefficients $a_1$, $a_2$, $b_0$, $b_1$, and $b_2$ is written into the second section of the memory within the filtering section 6. As a result, the actual intermediate/higher-side cutoff frequency of the filtering section 6 is substantially set or equalized to the desired cutoff frequency represented by the command signal.

The logarithmically averaging processes implemented by the logarithmically averaging sections 9 and 10 provide a good auditory sensation about a change of cutoff frequencies of the filtering section 6.

Seventh Embodiment

A seventh embodiment of this invention is similar to the first embodiment (FIGS. 4–8) thereof except for design changes indicated hereinafter.

Figure 16:
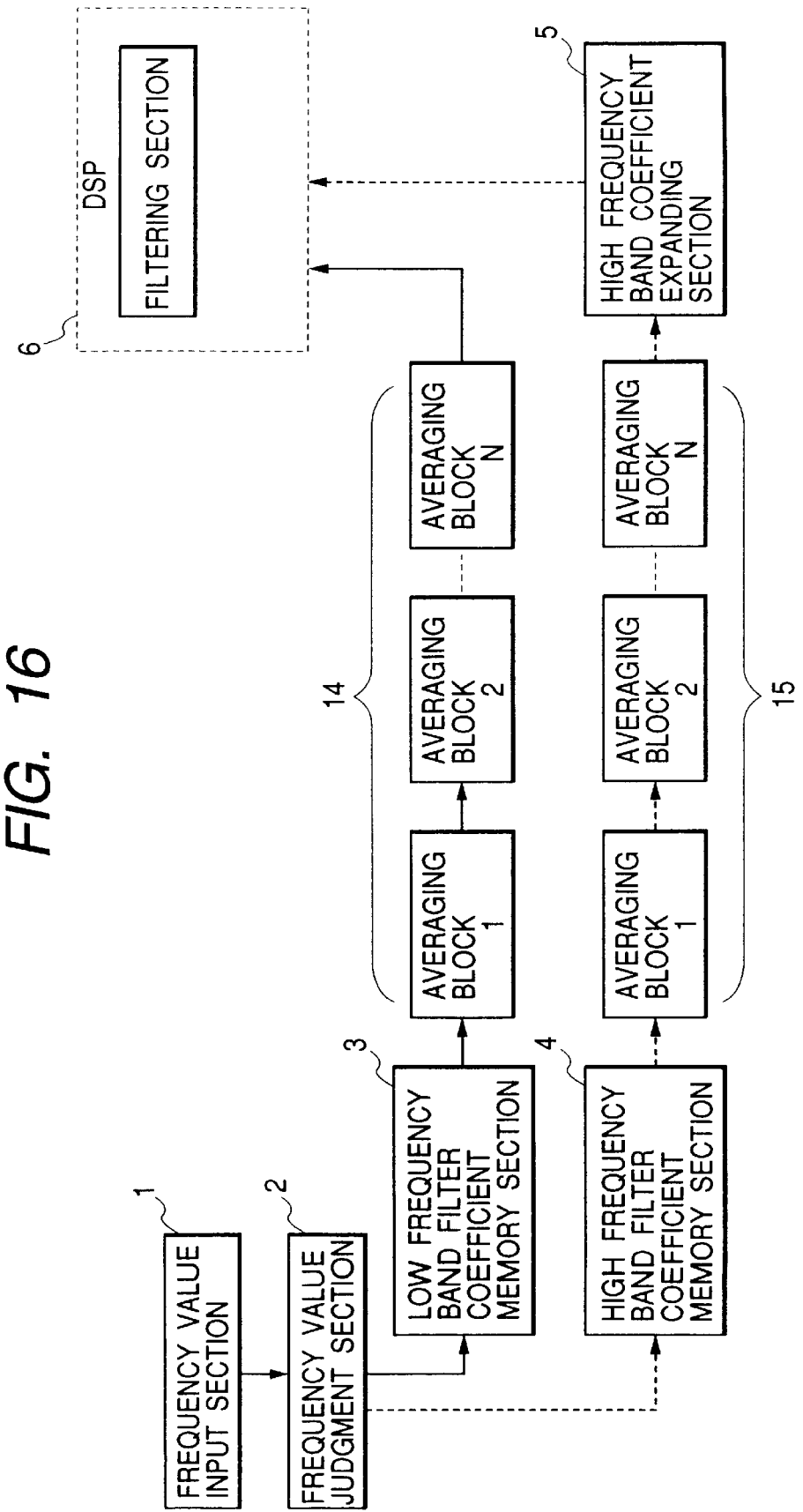
FIG. 16 is an operation flow diagram of a digital filter device according to a seventh embodiment of this invention.

FIG. 16 is an operation flow diagram of a digital filter device in the seventh embodiment of this invention. With reference to FIG. 16, an averaging section (interpolating section) 14 is provided between a memory section 3 and a filtering section 6. In addition, an averaging section (interpolating section) 15 is provided between a memory section 4 and a coefficient expanding section 5.

The averaging section 14 includes a cascade combination (series combination) of 1-st to N-th partial averaging blocks where N denotes a predetermined natural number equal to or greater than 2. The averaging section 15 includes a cascade combination (series combination) of 1-st to N-th partial averaging blocks.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The 1-st partial averaging block in the averaging section 14 calculates mean filter coefficients between the filter coefficients in the first set and the filter coefficients in the second set as the averaging section 7 in FIG. 9 does. Each of the 2-nd to N-th partial averaging blocks in the averaging section 14 similarly calculates mean filter coefficients with respect to inputted filter coefficients assigned to two neighboring cutoff frequencies. The averaging calculation implemented by each of the 1-st to N-th partial averaging blocks in the averaging section 14 uses equations similar to the equations (14)–(18).

In the case where a desired higher-side cutoff frequency represented by a command signal is equal to none of cutoff frequencies corresponding to respective sets of precalculated basic filter coefficients "α" and "β" in the memory section 4, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 4. The 1-st averaging block in the averaging section 15 calculates mean basic coefficients between the basic coefficients in the first set and the basic coefficients in the second set as the averaging section 8 in FIG. 9 does. Each of the 2-nd to N-th partial averaging blocks in the averaging section 15 similarly calculates mean basic coefficients with respect to inputted basic coefficients assigned to two neighboring cutoff frequencies.

Operation of the digital filter device in the seventh embodiment of this invention is basically similar to the operation of the digital filter device in the second embodiment (FIG. 9) of this invention. The averaging section 14 multiplies the total number of different usable sets of filter coefficients $a_1$, $a_2$, $b_0$, $b_1$, and $b_2$ by a factor of 2N without increasing the capacity of the memory section 3. The averaging section 15 multiplies the total number of different usable sets of basic coefficients "α" and "β" by a factor of 2N without increasing the capacity of the memory section 4.

Eighth Embodiment

An eighth embodiment of this invention is similar to the first embodiment (FIGS. 4–8) thereof except for design changes indicated hereinafter.

Figure 17:
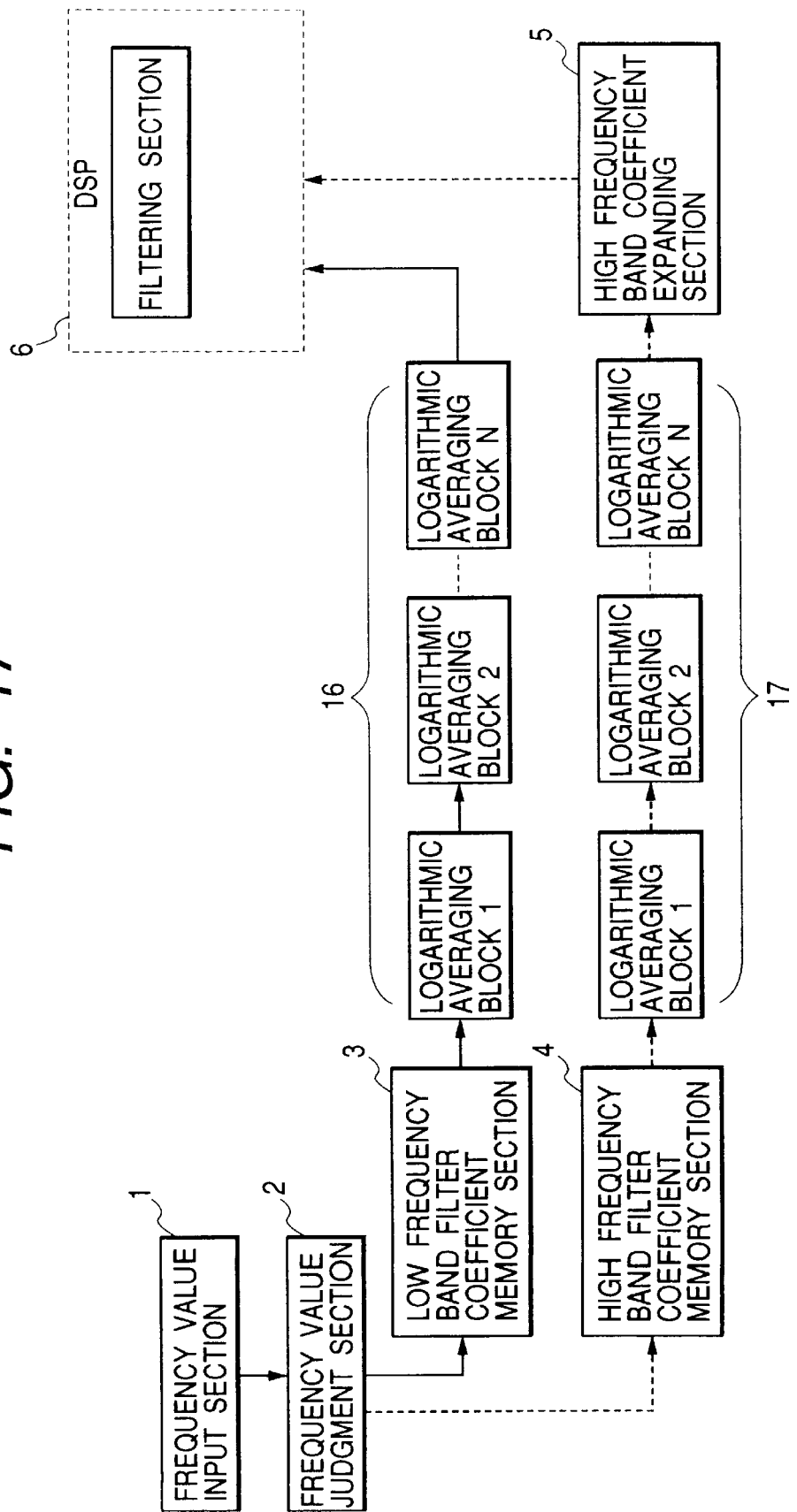
FIG. 17 is an operation flow diagram of a digital filter device according to an eighth embodiment of this invention.

FIG. 17 is an operation flow diagram of a digital filter device in the eighth embodiment of this invention. With reference to FIG. 17, a logarithmically averaging section (logarithmically interpolating section) 16 is provided between a memory section 3 and a filtering section 6. In addition, a logarithmically averaging section (logarithmically interpolating section) 17 is provided between a memory section 4 and a coefficient expanding section 5.

The logarithmically averaging section 16 includes a cascade combination (series combination) of 1-st to N-th partial logarithmically averaging blocks where N denotes a predetermined natural number equal to or greater than 2. The logarithmically averaging section 17 includes a cascade combination (series combination) of 1-st to N-th partial logarithmically averaging blocks.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The 1-st logarithmically averaging block in the logarithmically averaging section 16 calculates mean filter coefficients between the filter coefficients in the first set and the filter coefficients in the second set as the logarithmically averaging section 9 in FIG. 12 does. Each of the 2-nd to N-th partial logarithmically averaging blocks in the averaging section 16 similarly calculates mean filter coefficients with respect to inputted filter coefficients assigned to two neighboring cutoff frequencies. The logarithmically averaging calculation implemented by each of the 1-st to N-th partial logarithmically averaging blocks in the averaging section 16 uses equations similar to the equations (19)–(23).

In the case where a desired higher-side cutoff frequency represented by a command signal is equal to none of cutoff frequencies corresponding to respective sets of precalculated basic filter coefficients "0" and "β" in the memory section 4, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 4. The 1-st logarithmically averaging block in the logarithmically averaging section 17 calculates mean basic coefficients between the basic coefficients in the first set and the basic coefficients in the second set as the logarithmically averaging section 10 in FIG. 12 does. Each of the 2-nd to N-th partial logarithmically averaging blocks in the logarithmically averaging section 17 similarly calculates mean basic coefficients with respect to inputted basic coefficients assigned to two neighboring cutoff frequencies. The logarithmically averaging calculation implemented by each of the 1-st to N-th partial logarithmically averaging blocks in the averaging section 17 uses equations similar to the equations (24) and (25).

Operation of the digital filter device in the eighth embodiment of this invention is basically similar to the operation of the digital filter device in the third embodiment (FIG. 12) of this invention. The logarithmically averaging section 16 multiplies the total number of different usable sets of filter coefficients $a_1$, $a_2$, $b_0$, $b_1$, and $b_2$ by a factor of 2N without increasing the capacity of the memory section 3. The logarithmically averaging section 17 multiplies the total number of different usable sets of basic coefficients "α" and "β" by a factor of 2N without increasing the capacity of the memory section 4. The logarithmically averaging processes implemented by the logarithmically averaging sections 16 and 17 provide a good auditory sensation about a change of cutoff frequencies of the filtering section 6.

Ninth Embodiment

A ninth embodiment of this invention is similar to the fourth embodiment (FIG. 13) thereof except for design changes indicated hereinafter.

Figure 18:
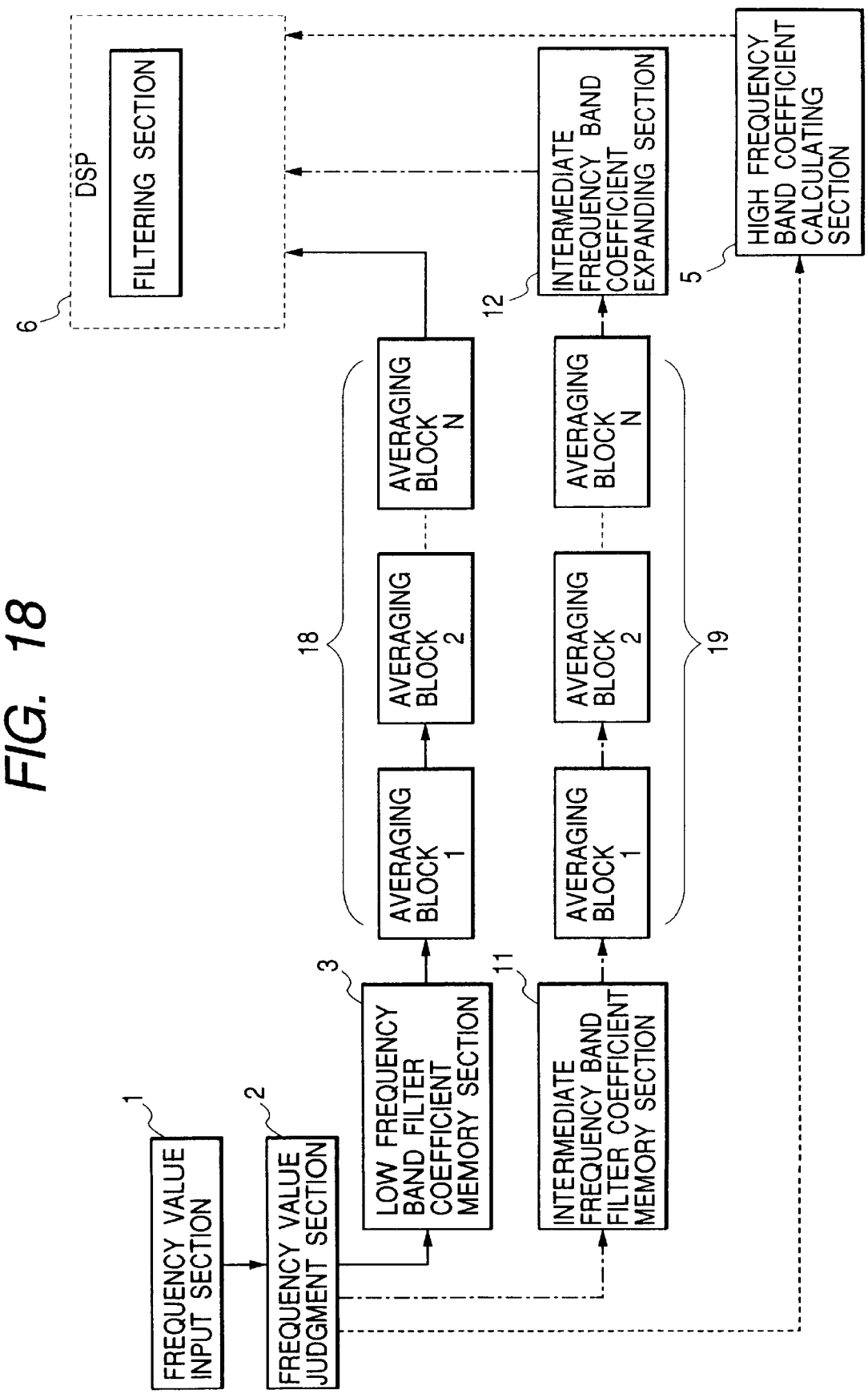
FIG. 18 is an operation flow diagram of a digital filter device according to a ninth embodiment of this invention.

FIG. 18 is an operation flow diagram of a digital filter device in the ninth embodiment of this invention. With reference to FIG. 18, an averaging section (interpolating section) 18 is provided between a memory section 3 and a filtering section 6. In addition, an averaging section (interpolating section) 19 is provided between a memory section 11 and a coefficient expanding section 12.

The averaging section 18 includes a cascade combination (series combination) of 1-st to N-th partial averaging blocks where N denotes a predetermined natural number equal to or greater than 2. The averaging section 19 includes a cascade combination (series combination) of 1-st to N-th partial averaging blocks.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The 1-st partial averaging block in the averaging section 18 calculates mean filter coefficients between the filter coefficients in the first set and the filter coefficients in the second set as the averaging section 7 in FIG. 9 does. Each of the 2-nd to N-th partial averaging blocks in the averaging section 18 similarly calculates mean filter coefficients with respect to inputted filter coefficients assigned to two neighboring cutoff frequencies. The averaging calculation implemented by each of the 1-st to N-th partial averaging blocks in the averaging section 18 uses equations similar to the equations (14)–(18).

In the case where a desired intermediate cutoff frequency represented by a command signal is equal to none of cutoff frequencies corresponding to respective sets of precalculated basic filter coefficients "α" and "β" in the memory section 11, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 11. The 1-st averaging block in the averaging section 19 calculates mean basic coefficients between the basic coefficients in the first set and the basic coefficients in the second set as the averaging section 8 in FIG. 9 does. Each of the 2-nd to N-th partial averaging blocks in the averaging section 19 similarly calculates mean basic coefficients with respect to inputted basic coefficients assigned to two neighboring cutoff frequencies.

Operation of the digital filter device in the ninth embodiment of this invention is basically similar to the operation of the digital filter device in the fourth embodiment (FIG. 14) of this invention. The averaging section 18 multiplies the total number of different usable sets of filter coefficients $a_1$, $a_2$, $b_0$, $b_1$, and $b_2$ by a factor of 2N without increasing the capacity of the memory section 3. The averaging section 19 multiplies the total number of different usable sets of basic coefficients "α" and "β" by a factor of 2N without increasing the capacity of the memory section 11.

Tenth Embodiment

A tenth embodiment of this invention is similar to the fourth embodiment (FIG. 13) thereof except for design changes indicated hereinafter.

Figure 19:
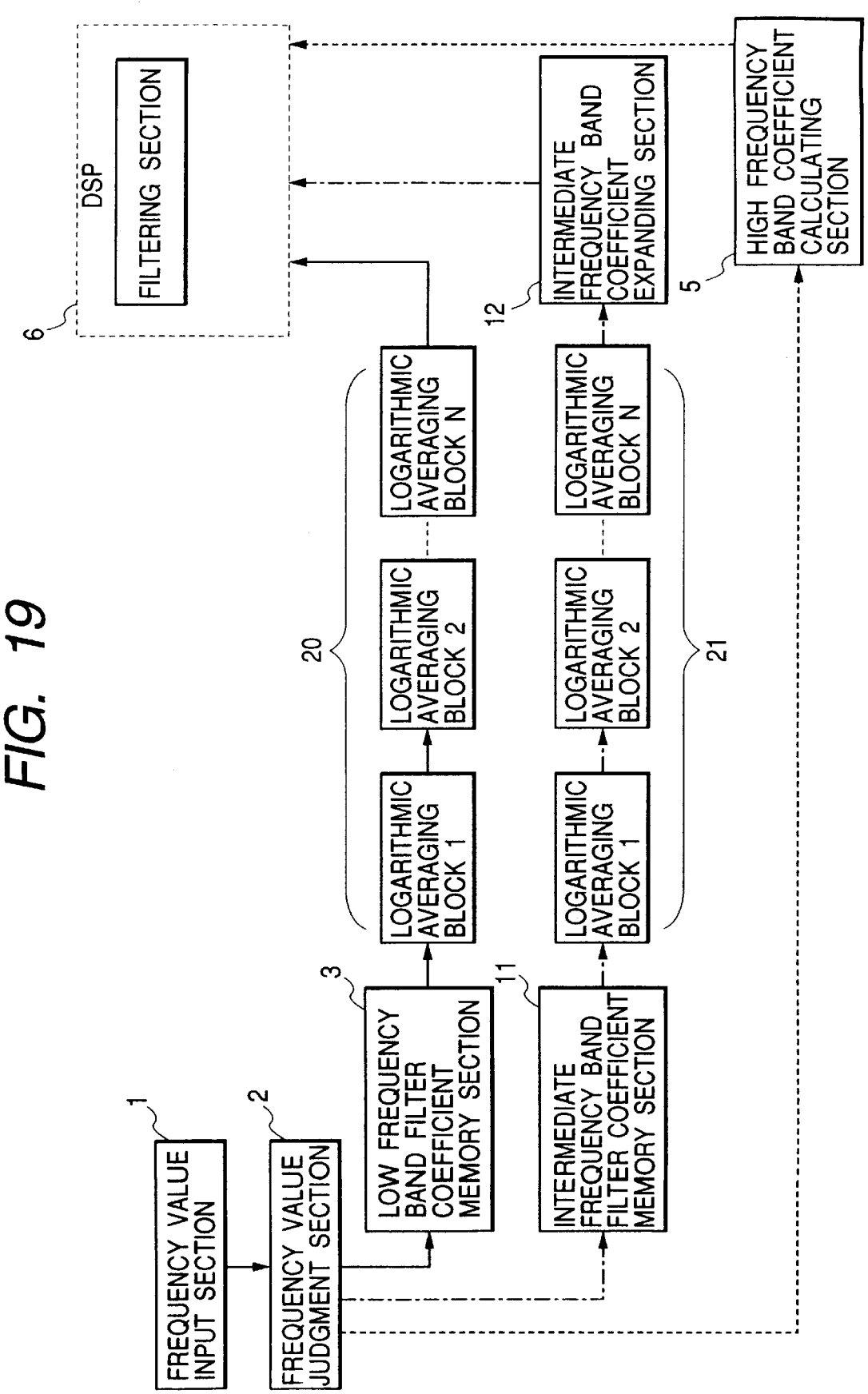
FIG. 19 is an operation flow diagram of a digital filter device according to a tenth embodiment of this invention.

FIG. 19 is an operation flow diagram of a digital filter device in the tenth embodiment of this invention. With reference to FIG. 19, a logarithmically averaging section (logarithmically interpolating section) 20 is provided between a memory section 3 and a filtering section 6. In addition, a logarithmically averaging section (logarithmically interpolating section) 21 is provided between a memory section 11 and a coefficient expanding section 12.

The logarithmically averaging section 20 includes a cascade combination (series combination) of 1-st to N-th partial logarithmically averaging blocks where N denotes a predetermined natural number equal to or greater than 2. The logarithmically averaging section 21 includes a cascade combination (series combination) of 1-st to N-th partial logarithmically averaging blocks.

In the case where a desired lower-side cutoff frequency represented by a command signal is equal to none of cutoff frequencies corresponding to respective sets of filter coefficients $a_1$, $a_2$, $b_0$, $b_1$, and $b_2$ in the memory section 3, an interpolation process is implemented as follows. A signal of a first set of filter coefficients assigned to a cutoff frequency immediately below the desired cutoff frequency and a signal of a second set of filter coefficients assigned to a cutoff frequency immediately above the desired cutoff frequency are read out from the memory section 3. The 1-st logarithmically averaging block in the logarithmically averaging section 20 calculates mean filter coefficients between the filter coefficients in the first set and the filter coefficients in the second set as the logarithmically averaging section 9 in FIG. 12 does. Each of the 2-nd to N-th partial logarithmically averaging blocks in the averaging section 20 similarly calculates mean filter coefficients with respect to inputted filter coefficients assigned to two neighboring cutoff frequencies. The logarithmically averaging calculation implemented by each of the 1-st to N-th partial logarithmically averaging blocks in the averaging section 20 uses equations similar to the equations (19)–(23).

In the case where a desired intermediate cutoff frequency represented by a command signal is equal to none of cutoff frequencies corresponding to respective sets of precalculated basic filter coefficients "α" and "β" in the memory section 11, an interpolation process is implemented as follows. A signal of a first set of precalculated basic coefficients assigned to a cutoff frequency immediately below the desired cutoff frequency and a signal of a second set of precalculated basic coefficients assigned to a cutoff frequency immediately above the desired cutoff frequency are read out from the memory section 11. The 1-st logarithmically averaging block in the logarithmically averaging section 21 calculates mean basic coefficients between the basic coefficients in the first set and the basic coefficients in the second set as the logarithmically averaging section 10 in FIG. 12 does. Each of the 2-nd to N-th partial logarithmically averaging blocks in the logarithmically averaging section 21 similarly calculates mean basic coefficients with respect to inputted basic coefficients assigned to two neighboring cutoff frequencies. The logarithmically averaging calculation implemented by each of the 1-st to N-th partial logarithmically averaging blocks in the averaging section 21 uses equations similar to the equations (24) and (25).

Operation of the digital filter device in the tenth embodiment of this invention is basically similar to the operation of the digital filter device in the sixth embodiment (FIG. 15) of this invention. The logarithmically averaging section 20 multiplies the total number of different usable sets of filter coefficients $a_1$, $a_2$, $b_0$, $b_1$, and $b_2$ by a factor of 2N without increasing the capacity of the memory section 3. The logarithmically averaging section 21 multiplies the total number of different usable sets of basic coefficients "$\alpha$" and "$\beta$" by a factor of 2N without increasing the capacity of the memory section 11. The logarithmically averaging processes implemented by the logarithmically averaging sections 20 and 21 provide a good auditory sensation about a change of cutoff frequencies of the filtering section 6.

Eleventh Embodiment

An eleventh embodiment of this invention is similar to one of the first to tenth embodiment thereof except that an IIR filter is of a given-number-order type other than the second-order type.

Twelfth Embodiment

A twelfth embodiment of this invention is similar to one of the first to tenth embodiments thereof except that the PKG is replaced by an SHL (shelving low pass filter), an SHH (shelving high pass filter), an HPF (high pass filter), or an LPF (low pass filter).

Thirteenth Embodiment

A thirteenth embodiment of this invention is similar to one of the second, third, fifth, sixth, seventh, eighth, ninth, and tenth embodiments thereof except that the averaging process is implemented after the coefficient expanding process.

Fourteenth Embodiment

A fourteenth embodiment of this invention is similar to the first to thirteenth embodiments thereof except that the DSP is replaced by a CPU or another hardware device forming a filtering section.

What is claimed is:
1. A filter device comprising:
first means for receiving data of a desired cutoff frequency;
second means for deciding which of a predetermined low frequency band, a predetermined intermediate frequency band, and a predetermined high frequency band the desired cutoff frequency exists in, the predetermined low frequency band being lower in frequency than the predetermined intermediate frequency band, the predetermined intermediate frequency band being lower in frequency than the predetermined high frequency band;
third means for storing data of filter coefficients corresponding to different cutoff frequencies in the predetermined low frequency band;
fourth means for storing data of precalculated basic coefficients corresponding to different cutoff frequencies in the predetermined intermediate frequency band, the precalculated basic coefficients being equal to values resulting from a part of calculation to provide final filter coefficients;
fifth means for calculating final filter coefficients from precalculated basic coefficients through a coefficient expanding process;
sixth means for calculating filter coefficients from a cutoff frequency in the predetermined high frequency band;
a filtering section;
seventh means for, in cases where the second means decides that the desired cutoff frequency is in the predetermined low frequency band, reading out data of filter coefficients corresponding to the desired cutoff frequency from the third means, and setting the data of the filter coefficients corresponding to the desired cutoff frequency in the filtering section;
eighth means for, in cases where the second means decides that the desired cutoff frequency is in the predetermined intermediate frequency band, reading out data of precalculated basic coefficients corresponding to the desired cutoff frequency from the fourth means, causing the fifth means to calculate final filter coefficients from the read-out precalculated basic coefficients, and setting data of the calculated final filter coefficients in the filtering section; and
ninth means for, in cases where the second means decides that the desired cutoff frequency is in the predetermined high frequency band, causing the sixth means to calculate filter coefficients from the desired cutoff frequency, and setting data of the calculated filter coefficients in the filtering section.

2. A filter device as recited in claim 1, further comprising first interpolating means for implementing interpolation with respect to the filter coefficients represented by the data read out from the third means, and second interpolating means for implementing interpolation with respect to the data read out from the fourth means or the final filter coefficients calculated by the fifth means.

3. A filter device as recited in claim 1, further comprising first interpolating means for implementing logarithmic interpolation with respect to the filter coefficients represented by the data read out from the third means, and second interpolating means for implementing logarithmic interpolation with respect to the data read out from the fourth means or the final filter coefficients calculated by the fifth means.

4. A filter device as recited in claim 2, wherein each of the first and second interpolating means comprises N partial interpolating means for implementing double interpolation, and N denotes a predetermined natural number equal to or greater than 2.

5. A filter device as recited in claim 3, wherein each of the first and second logarithmically interpolating means comprises N partial logarithmically interpolating means for implementing double logarithmic interpolation, and N denotes a predetermined natural number equal to or greater than 2.

6. A method of acquiring filter coefficients, comprising the steps of:
1) receiving data of a desired cutoff frequency;
2) deciding which of a predetermined low frequency band, a predetermined intermediate frequency band, and a predetermined high frequency band the desired cutoff frequency exists in, the predetermined low frequency band being lower in frequency than the predetermined intermediate frequency band, the predetermined intermediate frequency band being lower in frequency than the predetermined high frequency band;

3) in cases where the step 2) decides that the desired cutoff frequency is in the predetermined low frequency band, reading out data of filter coefficients corresponding to the desired cutoff frequency from a first memory section, and setting the data of the filter coefficients corresponding to the desired cutoff frequency in a filtering section;

4) in cases where the step 2) decides that the desired cutoff frequency is in the predetermined intermediate frequency band, reading out data of precalculated basic coefficients corresponding to the desired cutoff frequency from a second memory section, calculating final filter coefficients from the read-out precalculated basic coefficients through a coefficient expanding process, and setting data of the calculated final filter coefficients in the filtering section; and 5) in cases where the step 2 decides that the desired cutoff frequency is in the predetermined high frequency band, calculating filter coefficients from the desired cutoff frequency, and setting data of the calculated filter coefficients in the filtering section.

7. A filter device comprising:

first means for deciding which of a predetermined low frequency band, a predetermined intermediate frequency band, and a predetermined high frequency band the desired cutoff frequency exists in, the predetermined low frequency band being lower in frequency than the predetermined intermediate frequency band, the predetermined intermediate frequency band being lower in frequency than the predetermined high frequency band;

second means for storing data of filter coefficients corresponding to different cutoff frequencies in the predetermined low frequency band;

third means for storing data of precalculated basic coefficients corresponding to different cutoff frequencies in the predetermined intermediate frequency band, the precalculated basic coefficients being equal to values resulting from a part of calculation to provide final filter coefficients;

a filtering section;

fourth means for, in cases where the first means decides that the desired cutoff frequency is in the predetermined low frequency band, reading out data of filter coefficients corresponding to the desired cutoff frequency from the second means, and setting the data of the filter coefficients corresponding to the desired cutoff frequency in the filtering section;

fifth means for, in cases where the first means decides that the desired cutoff frequency is in the predetermined intermediate frequency band, reading out data of precalculated basic coefficients corresponding to the desired cutoff frequency from the third means, calculating final filter coefficients from the read-out precalculated basic coefficients, and setting data of the calculated final filter coefficients in the filtering section; and sixth means for, in cases where the first means decides that the desired cutoff frequency is in the predetermined high frequency band, calculating filter coefficients from the desired cutoff frequency, and setting data of the calculated filter coefficients in the filtering section.

* * * * *